(12) United States Patent
Hayashi

(10) Patent No.: US 8,693,277 B2
(45) Date of Patent: Apr. 8, 2014

(54) SEMICONDUCTOR DEVICE INCLUDING PLURAL CHIPS STACKED TO EACH OTHER

(75) Inventor: Junichi Hayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 142 days.

(21) Appl. No.: 13/347,542

(22) Filed: Jan. 10, 2012

(65) Prior Publication Data

US 2012/0182822 A1    Jul. 19, 2012

(30) Foreign Application Priority Data

Jan. 14, 2011    (JP) .................................. 2011-005903

(51) Int. Cl.
*G11C 8/00*        (2006.01)

(52) U.S. Cl.
USPC ............... 365/230.03; 365/230.01; 365/63; 365/51; 365/233.1; 365/56

(58) Field of Classification Search
USPC ........... 365/230.03, 230.01, 63, 51, 233.1, 56
See application file for complete search history.

(56) References Cited

U.S. PATENT DOCUMENTS

| | | | |
|---|---|---|---|
| 6,079,023 A | 6/2000 | Yoon et al. | |
| 7,466,577 B2 * | 12/2008 | Sekiguchi et al. | ............... 365/51 |
| 7,489,030 B2 | 2/2009 | Shibata et al. | |
| 7,764,564 B2 * | 7/2010 | Saito et al. | ............... 365/230.03 |
| 7,790,171 B1 * | 9/2010 | Devaux et al. | ............. 424/188.1 |
| 7,795,706 B2 * | 9/2010 | Ikeda | ............................. 257/621 |
| 7,881,146 B2 * | 2/2011 | Baek et al. | ............... 365/230.06 |
| 8,019,589 B2 * | 9/2011 | Rajan et al. | ..................... 703/24 |
| 8,098,508 B2 * | 1/2012 | Janzen | ............................ 365/63 |
| 8,198,915 B2 * | 6/2012 | Yoko | ............................... 326/56 |
| 8,274,847 B2 * | 9/2012 | Yoko | ............................ 365/189.09 |
| 2007/0132085 A1 | 6/2007 | Shibata et al. | |

FOREIGN PATENT DOCUMENTS

| | | |
|---|---|---|
| JP | 11-203876 A | 7/1999 |
| JP | 2007-158237 A | 6/2007 |

* cited by examiner

*Primary Examiner* — Viet Q Nguyen
(74) *Attorney, Agent, or Firm* — McGinn IP Law Group, PLLC

(57) ABSTRACT

Such a device is disclosed that includes a first chip outputting a bank address signal and an active signal, and a plurality of second chips stacked on the first chip. Each of the second chips includes a plurality of memory banks each selected based on the bank address signal. Selected one or ones of the memory banks is brought into an active state in response to the active signal. Each of the second chips activates a local bank active signal when at least one of the memory banks included therein is in the active state. The first chip activates a bank active signal when at least one of the local bank active signals is activated.

17 Claims, 28 Drawing Sheets

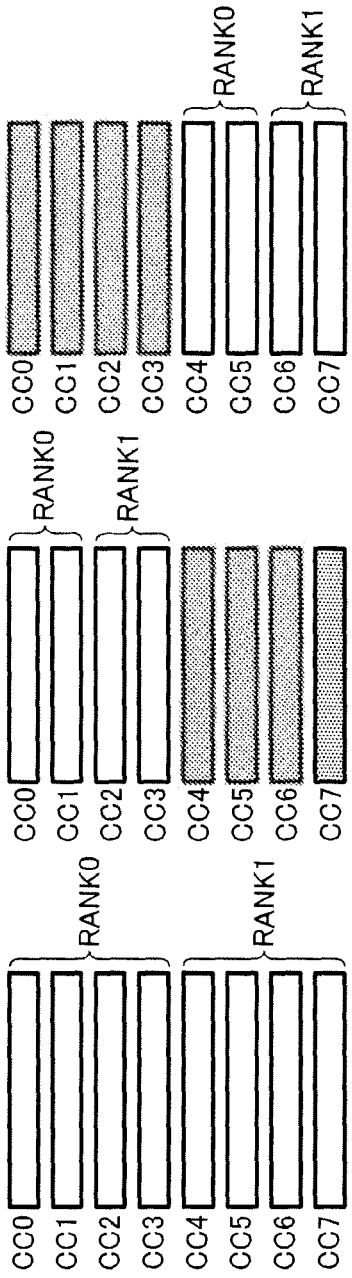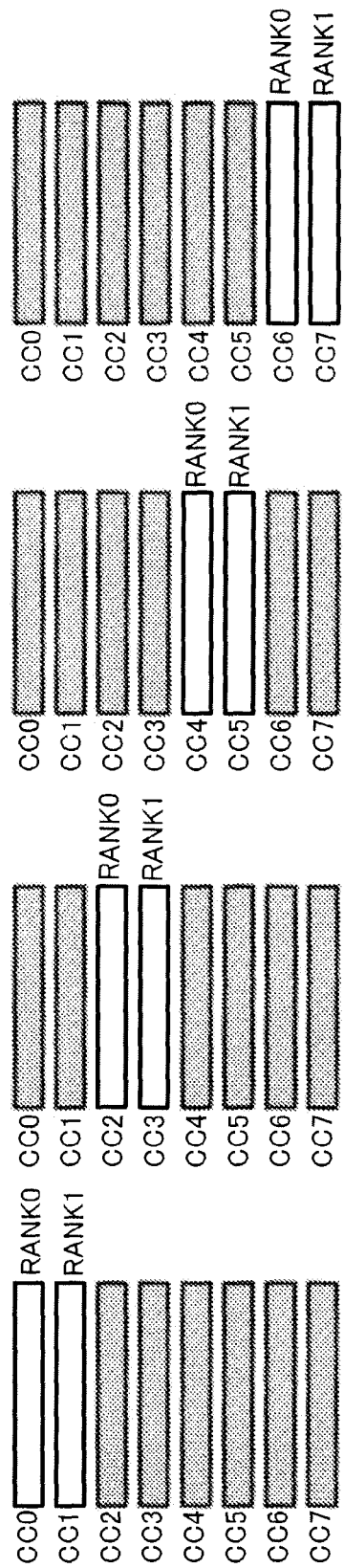

SEMICONDUCTOR DEVICE INCLUDING PLURAL CHIPS STACKED TO EACH OTHER

BACKGROUND OF THE INVENTION

1. Field of the Invention

The present invention relates to a semiconductor device, and more particularly to a semiconductor device in which a front-end portion having an interface function and a back-end portion including a memory core are integrated on an individual semiconductor chip.

2. Description of Related Art

In some semiconductor devices such as a DRAM (Dynamic Random Access Memory), a memory cell array is divided into a plurality of banks (see Japanese Patent Application Laid-open No. H11-203876). A bank is a unit capable of individually receiving commands, and each bank can operate independently of each other on a non-exclusive basis. The semiconductor device described in Japanese Patent Application Laid-open No. H11-203876 uses a memory array bank enable signal as a signal for bringing each bank to an active state, and activates an active array-voltage generator in response to the memory array bank enable signal. Thus, the signal indicating whether each bank is in the active state is used as a control signal for various circuit blocks included in the semiconductor device.

The active information of banks is also used to prevent reception of commands that cannot be executed in the active state. For example, a refresh command and the like are not to be executed unless all the banks are in inactive states. Accordingly, even if a refresh command is issued when at least one of the banks is in the active state, it is necessary to guard against the refresh command, and the active information is used also for this purpose.

On the other hand, there has recently been proposed a technique in which a so-called front-end portion performing an interface with a memory controller and a back-end portion including a memory core are integrated on an individual chip, and these chips are stacked to form a single semiconductor memory device (see Japanese Patent Application Laid-Open No. 2007-158237). According to this technique, in a core chip on which the back-end portion is integrated, a space that can be allocated to the memory core increases, whereby a storage capacity per 1 chip (per 1 core chip) can be increased. On the other hand, the interface chip on which the front-end portion is integrated can be manufactured by a process different from the process for the memory core, whereby a circuit can be formed with a high-speed transistor. Furthermore, plural core chips can be allocated to one interface chip, resulting in that a high-speed semiconductor memory device having extremely large capacity as a whole can be provided.

In the stacked semiconductor device, banks are distributed over a plurality of chips unlike in the normal semiconductor device with a one-chip configuration. Accordingly, if active information of all the banks is held on the interface chip side, it is possible to guard against the commands such as the refresh command that are not to be executed unless all the banks are in the inactive states.

However, because the stacked semiconductor device has much more banks than the normal semiconductor device with a one-chip configuration, the circuit scale of the interface chip is adversely increased if the active information of all the banks is held on the interface chip side.

SUMMARY

In one embodiment, there is provided a semiconductor device that includes: a first chip outputting a bank address signal and an active signal; and a plurality of second chips stacked on the first chip, each of the second chips including a plurality of memory banks each selected based on the bank address signal, selected one or ones of the memory banks being brought into an active state in response to the active signal. Each of the second chips activates a local bank active signal when at least one of the memory banks included therein is in the active state. The first chip activates a bank active signal when at least one of the local bank active signals is activated.

In another embodiment, there is provided a semiconductor device that includes: a plurality of core chips stacked to each other, each of the core chips includes a plurality of memory banks; and a control chip that controls the core chips. The control chip supplies a chip address signal and a bank address signal to the core chips in common in response to an active command, at least one of the core chips being selected based on the chip address signal, and at least one of the memory banks included in the selected one or ones of the core chips is brought into an active state based on the bank address signal. Each of the core chips activates a local bank active signal when at least one of the memory banks included therein is in the active state.

In still another embodiment, there is provided a semiconductor device that includes a plurality of core chips stacked to each other and an interface chip that controls the core chips. Each of the core chips includes a plurality of memory banks each including a plurality of memory cells. The memory banks can be brought into an active state independently from each other regardless of whether the memory banks are included in the same chip or not. The interface chip supplies a chip address signal, a bank address signal, an active signal, and a precharge signal to the core chips in common. Each of the banks is selected based on the chip address signal and the bank address signal. Selected one or ones of memory banks is in an active state during a period from activating the active signal to activating the precharge signal. Each of the core chips activates a local bank active signal when at least one of the memory banks included therein is in the active state. The interface chip activates a bank active signal when at least one of the local bank active signals is activated.

BRIEF DESCRIPTION OF THE DRAWINGS

FIG. 9 is a schematic view for explaining an address allocation in LRA-3 system;

FIG. 10 is a schematic view for explaining an address allocation in PRA-1 system;

FIG. 11 is a schematic view for explaining an address allocation in PRA-2 system;

FIGS. 21A to 21G are schematic diagrams for explaining a relation between ranks and the core chips CC0 to CC7 to be used;

DETAILED DESCRIPTION OF THE EMBODIMENTS

Preferred embodiments of the present invention will be explained below in detail with reference to the accompanying drawings.

Figure 1:
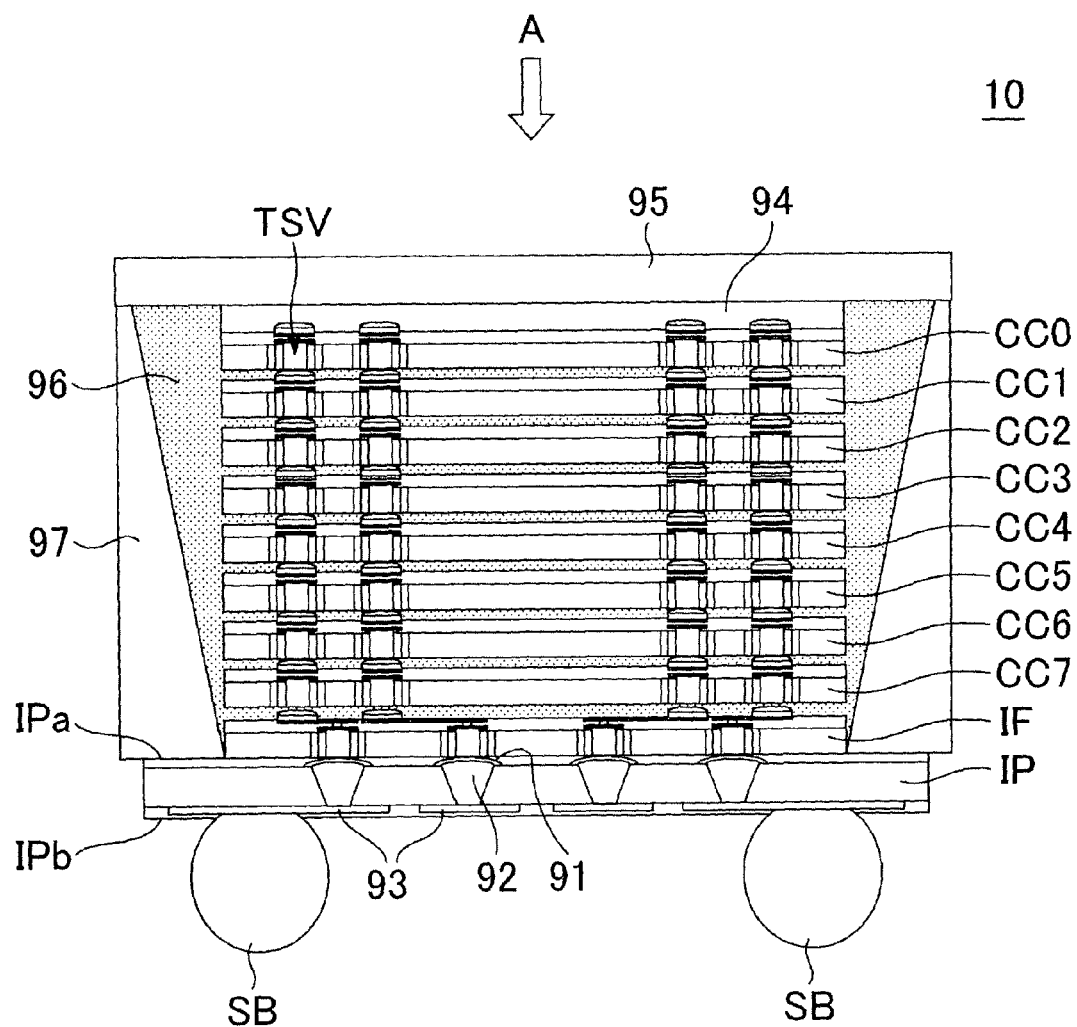
FIG. 1 is a schematic cross-sectional view for explaining a structure of a semiconductor device 10 according to an embodiment of the present invention.

Referring now to FIG. 1, the semiconductor device 10 according to this embodiment has the structure where 8 core chips (memory chips) CC0 to CC7 that have the same function and structure and are manufactured using the same manufacture mask, an interface chip IF that is manufactured using a manufacture mask different from that of the core chips CC0 to CC7 and an interposer IP are laminated. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The uppermost core chip CC0 may not have the through silicon via TSV. The through silicon vias may be referred to as penetration electrodes. The through silicon via may be referred to as a penetration electrode. Meanwhile, the interposer IP is a circuit board that is made of a resin, and plural external terminals (solder balls) SB are formed in a back surface IPb of the interposer IP.

The core chips CC0 to CC7 are semiconductor chips from which a so-called front-end portion, which performs an interface with an outside, of circuit blocks included in a normal stand-alone SDRAM (Synchronous Dynamic Random Access Memory), is removed. That is, each of the core chips CC0 to CC7 is a memory chip where only the circuit blocks belonging to the back end unit are integrated in principle. As the circuit blocks that are included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end portion of the circuit blocks included in the normal stand-alone SDRAM is integrated. The interface chip IF functions as a front-end portion common to 8 core chips CC0 to CC7. Accordingly, all of the external accesses are made through the interface chip IF, and data input and data output are made through the interface chip IF.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
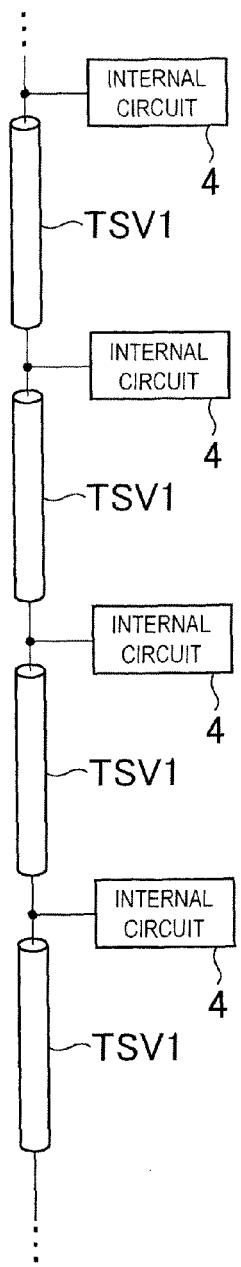
FIGS. 2A to 2C are diagrams indicative of an embodiment of various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
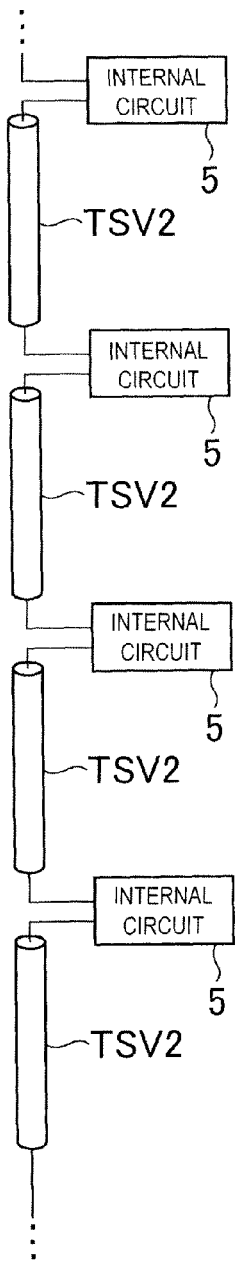

Meanwhile, as shown in FIG. 2B, the a part of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information to be described below is exemplified.

Figure 2C:
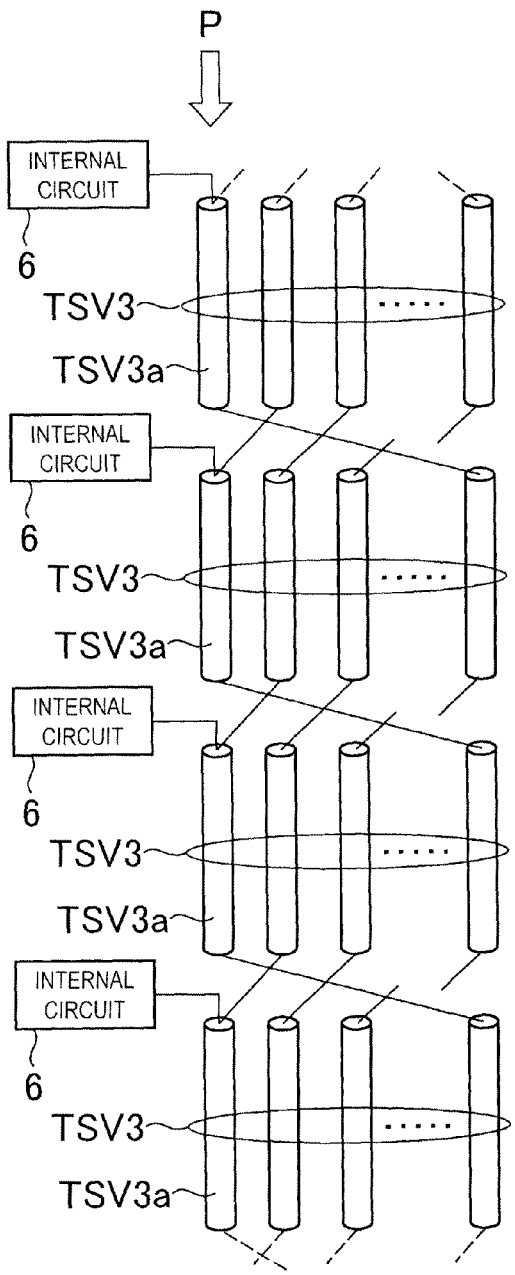

Another part of the through silicon vias TSV is short-circuited from the through silicon vias TSV of other layer provided at the different position in plan view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified. By using the through silicon vias TSV3, it is also possible to supply information individually from each of the core chips CC0 to CC7 to the interface chip IF. Such information includes a local bank active signal to be explained later.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
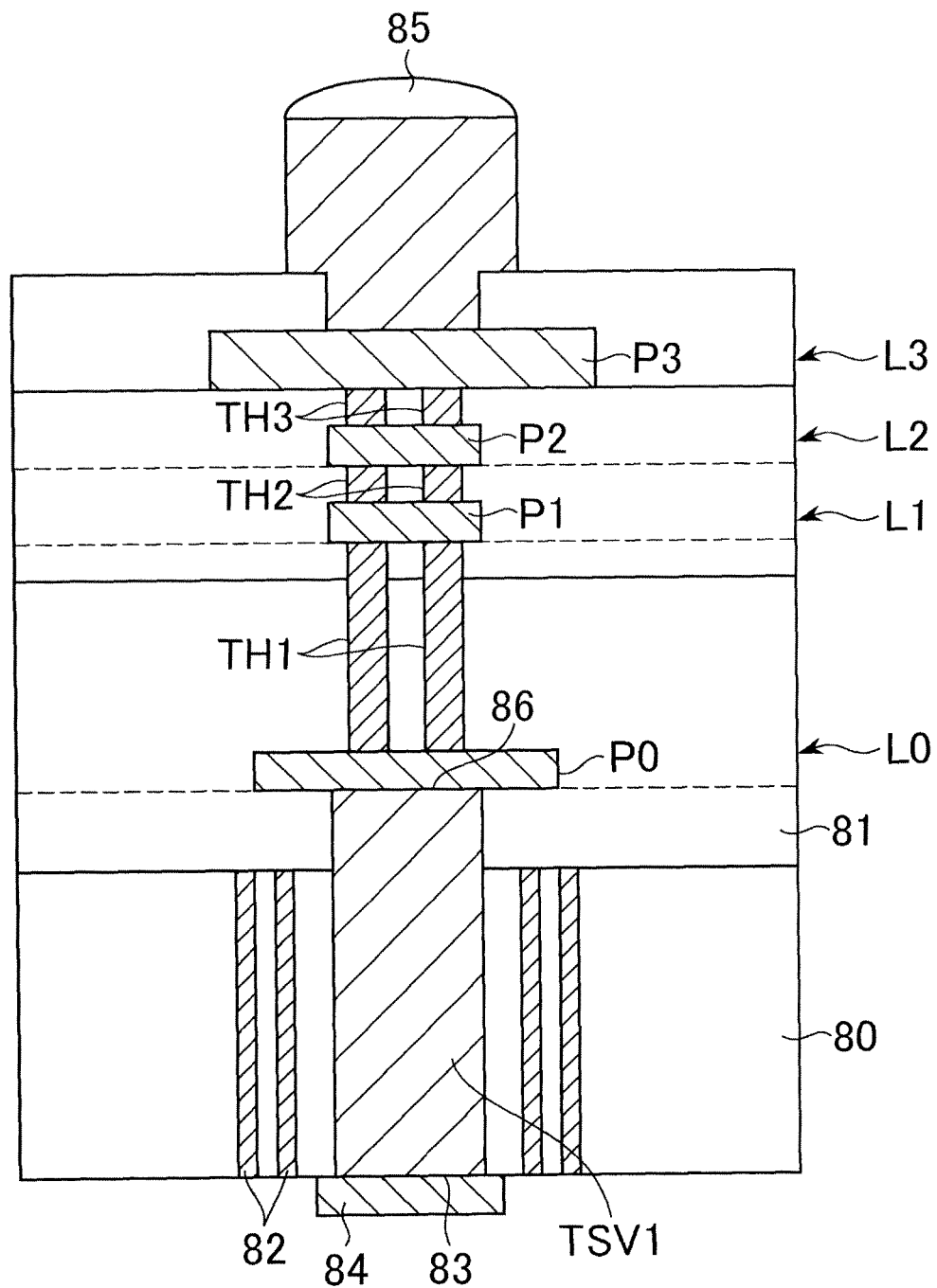
FIG. 3 is a cross-sectional view indicative of an embodiment of a structure of the through silicon via TSV1 of the type shown in FIG. 2A.

Turning to FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
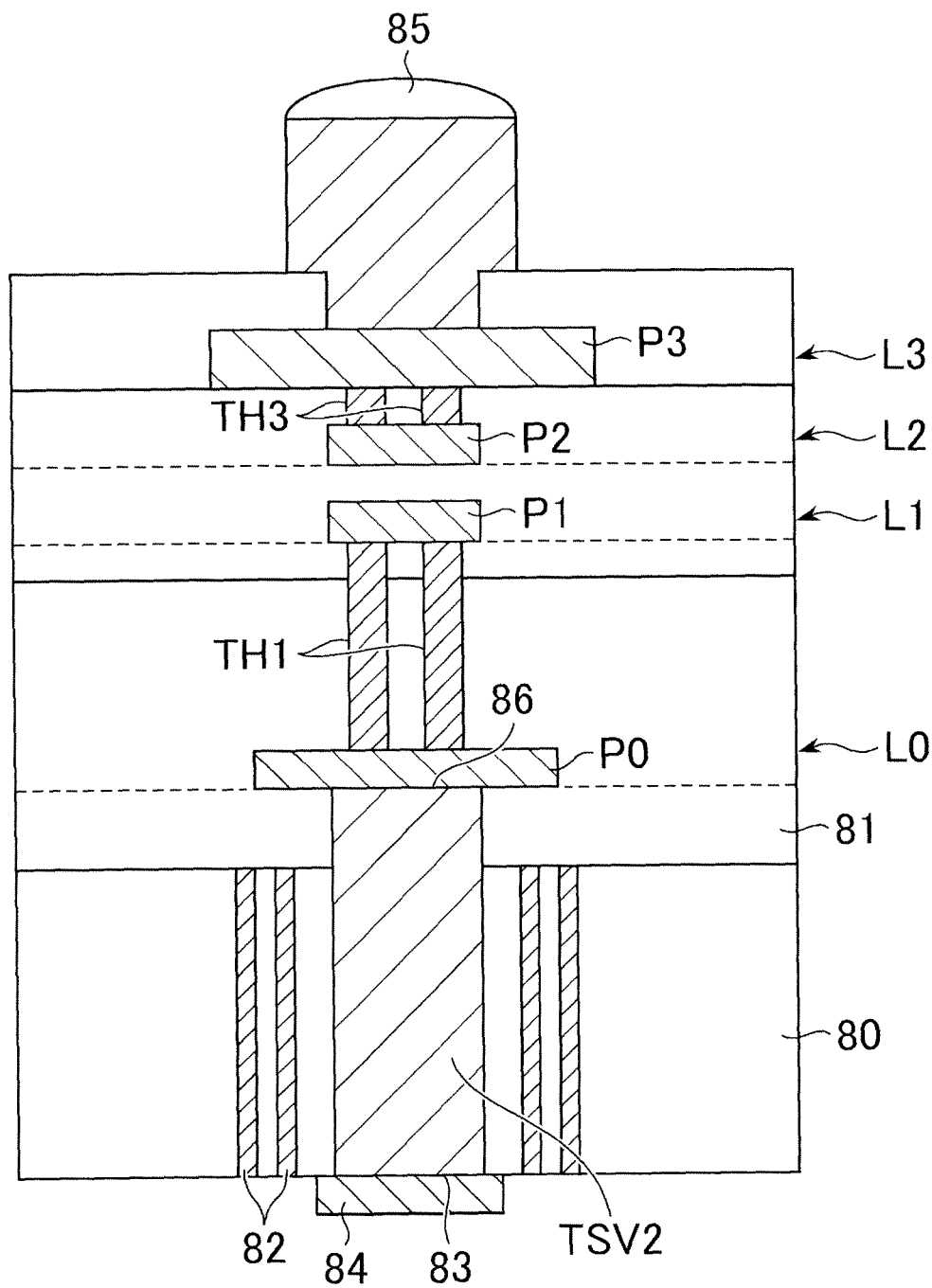
FIG. 4 is a cross-sectional view indicative of an embodiment of a structure of the through silicon via TSV2 of the type shown in FIG. 2B.

Turning to FIG. 4, the through silicon via TSV2 is different from the through silicon via TSV1 shown in FIG. 3 in that the through hole electrodes TH2 that directly connect the pads P1 and P2 located at the same plan position to each other are deleted. The pad P1 is connected to, for example, an output node of the internal circuit 5 shown in FIG. 2, and the pad P2 is connected to, for example, an input node of the internal circuit 5 shown in FIG. 2. This causes the respective internal circuits 5 provided in the core chips CC0 to CC7 to be cascaded through the through silicon vias TSV2.

Figure 5:
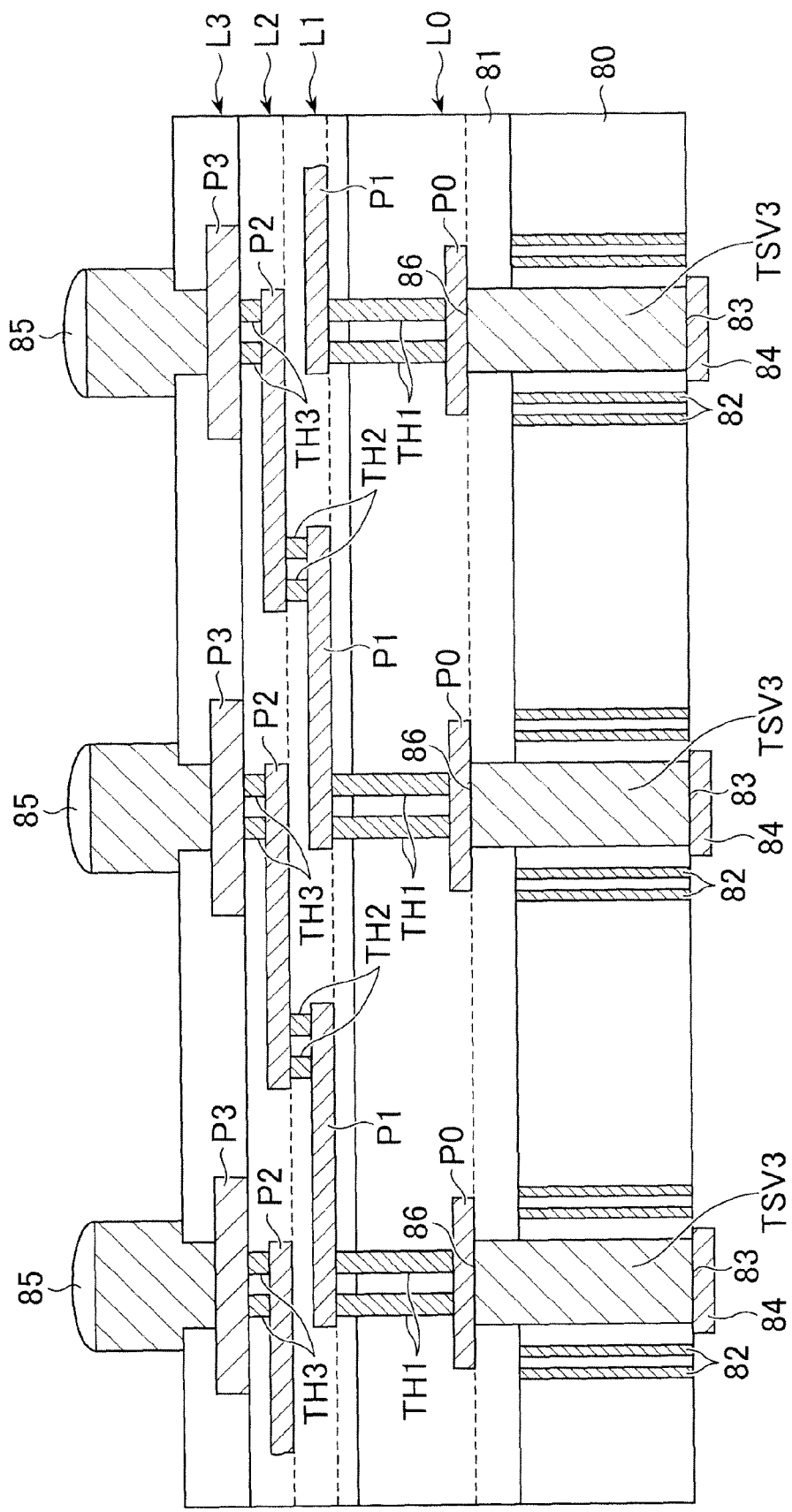
FIG. 5 is a cross-sectional view indicative of an embodiment of a structure of the through silicon via TSV3 of the type shown in FIG. 2C.
Figure 6:
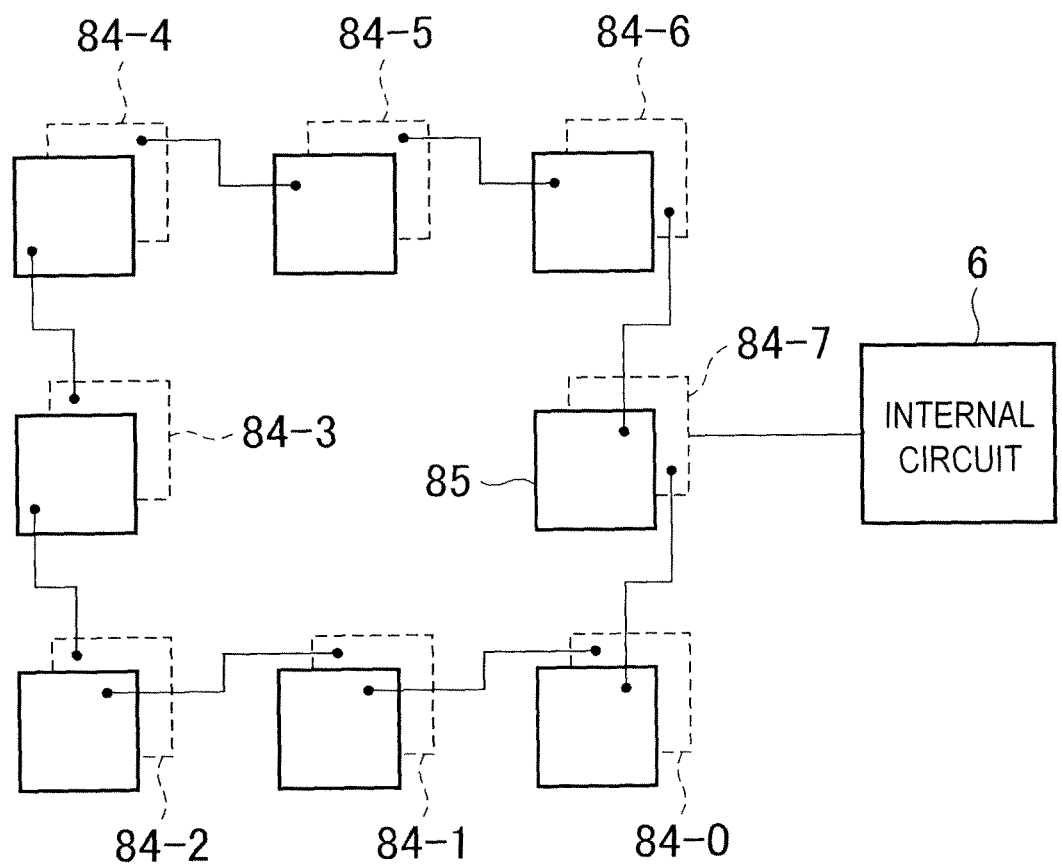
FIG. 6 is a schematic diagram for explaining a connection relation between through silicon vias TSV3 in respective core chips.

Turning to FIG. 5, in the through silicon vias TSV3, not the pads P1 and P2 located at the same plan position but the pads P1 and P2 located at different plan positions are connected by the though hole electrodes TH2. Although only three through silicon vias TSV3 are shown in FIG. 5, the through silicon vias TSV3 are provided in each of the core chips CC0 to CC7 by the number of core chips per signal (that is, eight). The eight through silicon vias TSV3 are connected cyclically as shown in FIG. 6. In FIG. 6, the front bumps 85 are shown by solid lines and the back bumps 84 are shown by broken lines. When the through silicon vias TSV3 are connected cyclically as shown in FIG. 6, different information can be supplied to each of the core chips CC0 to CC7 from the interface chip IF while the core chips CC0 to CC7 have the same circuit configuration. For example, when the internal circuit 6 is connected at the position of the back bump 84-7, signals supplied from the interface chip IF to the back bumps 84-0 to 84-7 of the lowermost core chip CC7 are selectively supplied to the internal circuits 6 of the core chips CC0 to CC7, respectively.

Before detailed circuit structures of the interface chip IF and the core chips CC0 to CC7 are described, an address allocation in a semiconductor device 10 according to the present embodiment will be described.

The semiconductor device 10 according to the present embodiment can change the address allocation by a mode selection. There are roughly prepared an LRA (Logical Rank Address) system and a PRA (Physical Rank Address) system in the semiconductor device 10. The LRA system is an address allocation system in which plural banks mounted to the different core chips CC0 to CC7, respectively, are handled as one bank by a controller. On the other hand, the PRA system is an address allocation system in which each of the plural banks mounted to the respective core chips CC0 to CC7 is handled as one bank. In the present embodiment, there are three types in the LEA system. Each of three types is referred to as LRA-1 system, LRA-2 system, and LRA-3 system, for the sake of convenience. In the present embodiment, there are two types in the PRA system, which are referred to as a PRA-1 system and a PRA-2 system for convenience sake. The respective systems will specifically be described below.

Turning to FIGS. 7 to 11, one square indicates a bank. Therefore, a single core chip includes banks 0 to 7.

Figure 7:
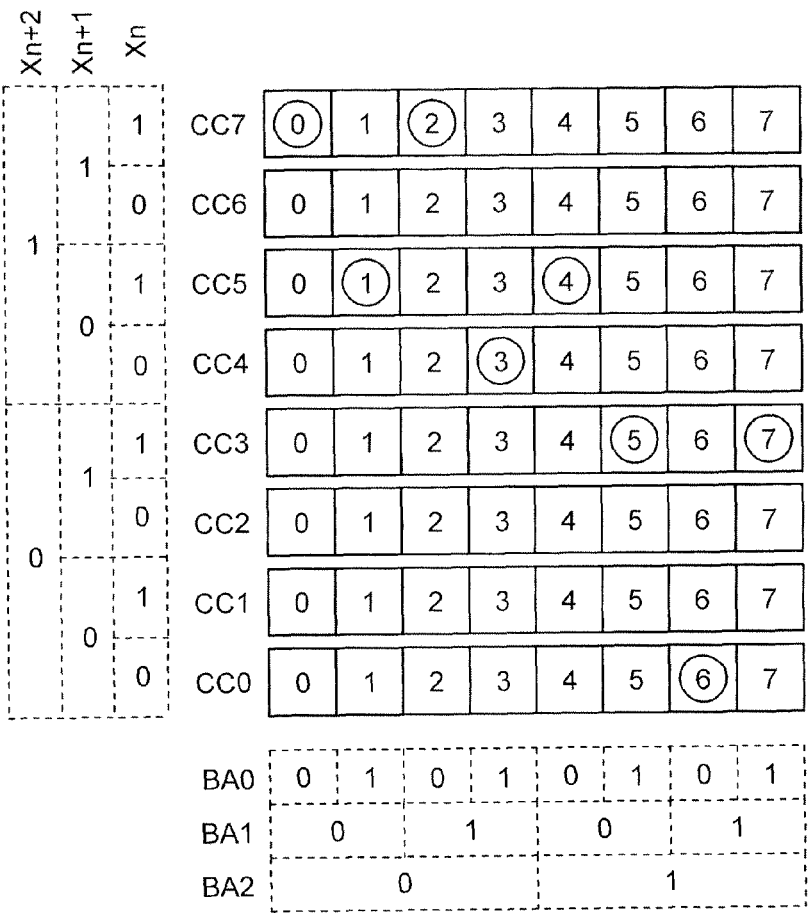
FIG. 7 is a schematic view for explaining an address allocation in LRA-1 system.

Referring to FIG. 7, in the LRA-1 system, any one of the core chips CC0 to CC7 is selected based upon a part of an address signal, which is Xn+2, Xn+1, and Xn (chip address), supplied during a row-access (upon an issuance of an active command ACT), and any one of banks 0 to 7 is selected based upon bank address signals BA0 to BA2 supplied during the row access and a column access. The controller recognizes 8 banks, included in the different core chips CC0 to CC7 and having the same number, as one bank.

In this system, the chip address is not supplied during the column access (upon the issuance of a column command). However, since the controller recognizes 8 banks, included in the different core chips CC0 to CC7 and having the same number, as one bank, the controller can identify to which one of the core chips CC0 to CC7 the column access is made during the column access, even if the chip address is not supplied. Because there is inevitably one core chip in which the bank designated upon the column access is in an active state.

For example, it is supposed that the encircled banks are in the active state in FIG. 7. If the designated bank upon the column access is the bank 0, the column access is made to the core chip CC7 in which the bank 0 is in the active state. If the designated bank upon the column access is the bank 1, the column access is made to the core chip CC5 in which the bank 1 is in the active state.

As described above, the selection of the core chips CC0 to CC7 is made during the row access in the LRA-1 system. The controller recognizes the core chips CC0 to CC7 as one DRAM, so that a chip selection signal (CS) to be used is also 1 bit. Therefore, the number of memory cells accessed by one row access becomes 1 kilobyte, and the number of the rank becomes 1.

Figure 8:
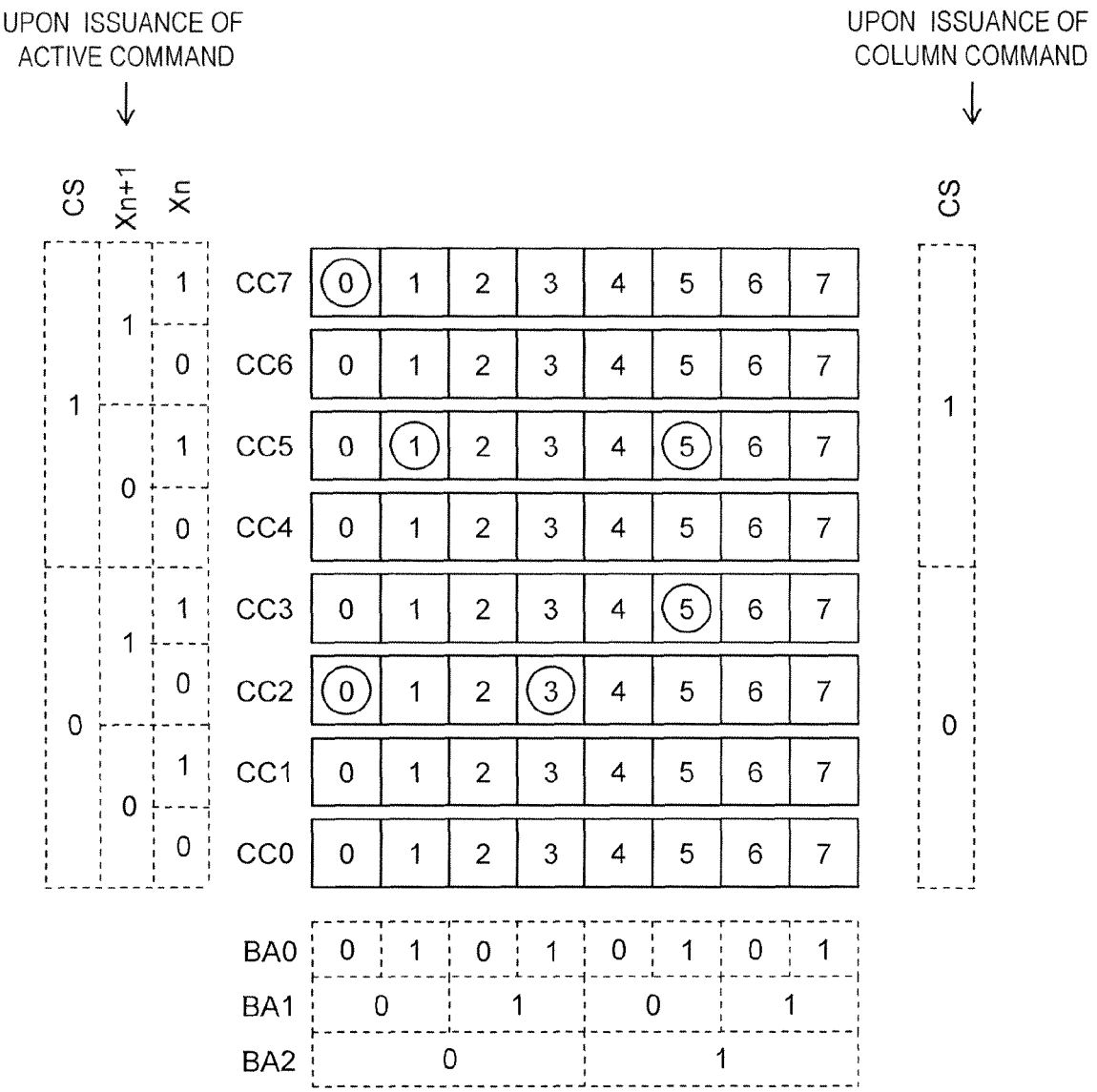
FIG. 8 is a schematic view for explaining an address allocation in LRA-2 system.

Turning to FIG. 8, in the LRA-2 system, the core chips CC0 to CC3 or the core chips CC4 to CC7 are selected based upon chip selection signals CS0 and CS1 of two bits, and any one of selected 4 core chips is selected based upon a part of an address signal, which is Xn+1, and Xn (chip address), supplied during a row-access. The bank address signals BA0 to BA2 are supplied during both the row access and the column access.

In this system, the core chips CC0 to CC3 or the core chips CC4 to CC7 are selected by using the chip selection signals, so that the rank number viewed from the controller becomes 2. Like the LRA-1 system, the selection of the core chips CC0 to CC7 is determined during the row access, so that the number of memory cells accessed by one row access becomes 1 kilobyte, as in the LRA-1 system. Although the chip address is not supplied during the column access, a problem is not caused with this situation, as in the LRA-1 system.

In this system, the core chips CC0 to CC3 and the core chips CC4 to CC7 are identified by the chip selection signals CS0 and CS1. Therefore, the banks belonging to the core chips CC0 to CC3 and the banks belonging to the core chips CC4 to CC7 are handled as different banks by the controller. Accordingly, the bank 0 in the core chip CC2 and the bank 0 in the core chip CC7 can be simultaneously brought into the active state as in the example in FIG. 8.

Figure 9:
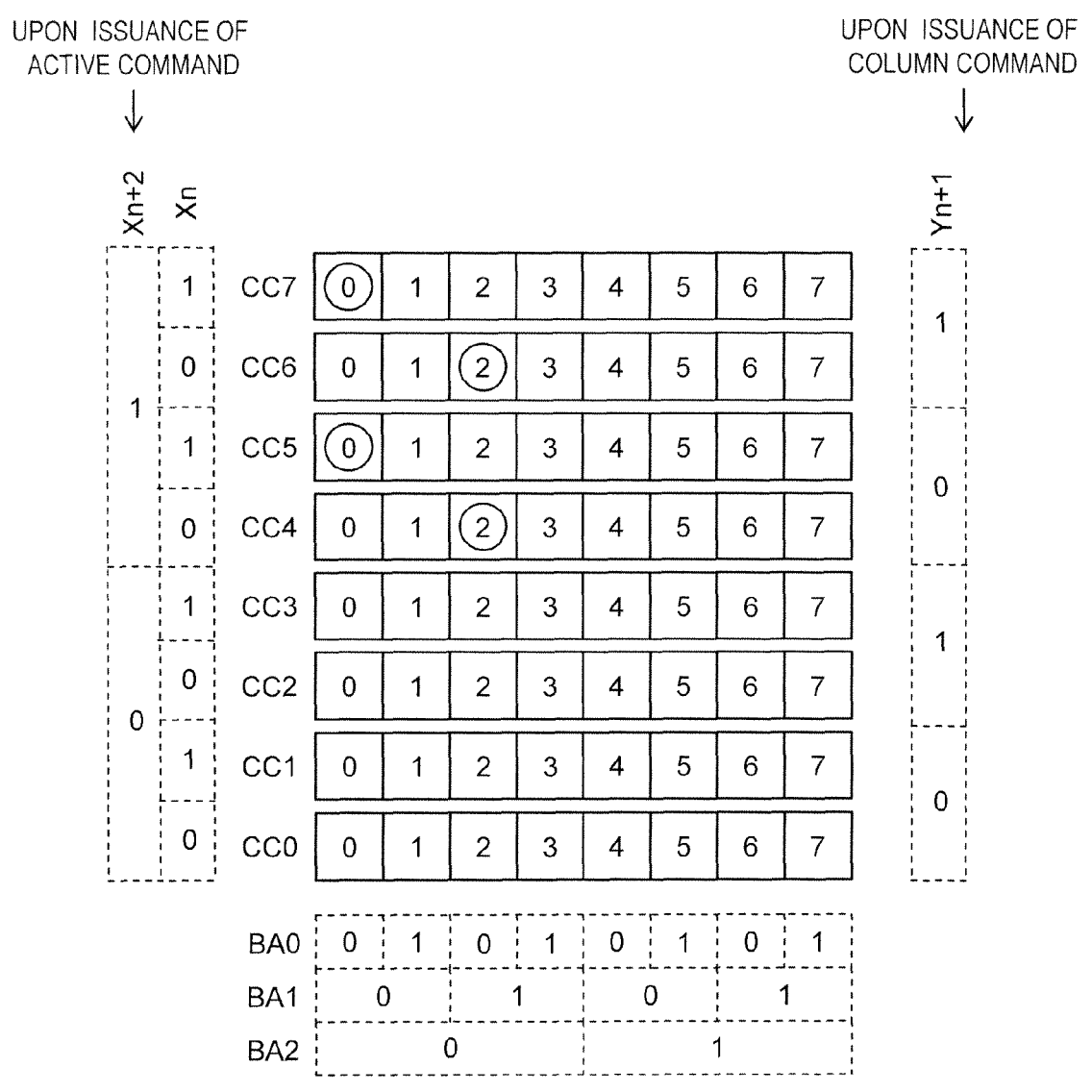

Turning to FIG. 9, in the LRA-3 system, any one set of the core chips CC0 and CC2, the core chips CC1 and CC3, the core chips CC4 and CC6, and the core chips CC5 and CC7 is selected based upon a part of the address signals, which is Xn+2 and Xn, supplied during the row access, and either one of the selected two core chips is selected based upon a part of the address signals, which is Yn+1, supplied during the column access. The bank address signals BA0 to BA2 are supplied during both the row access and the column access.

In this system, the selection of the core chips CC0 to CC7 is made based upon the part of the address signals, which is Xn+2 and Xn, supplied during the row access, and a part of the address signals, which is Yn+1, supplied during the column access. Therefore, the chip address becomes Xn+2, Xn, and Yn+1. Since two core chips are in the active state during the row access, the number of memory cells accessed by one row access becomes double that in the LRA-1 system and LRA-2 system. For example, it becomes 2 kilobytes. The rank number is 1, as in the LRA-1 system.

Figure 10:
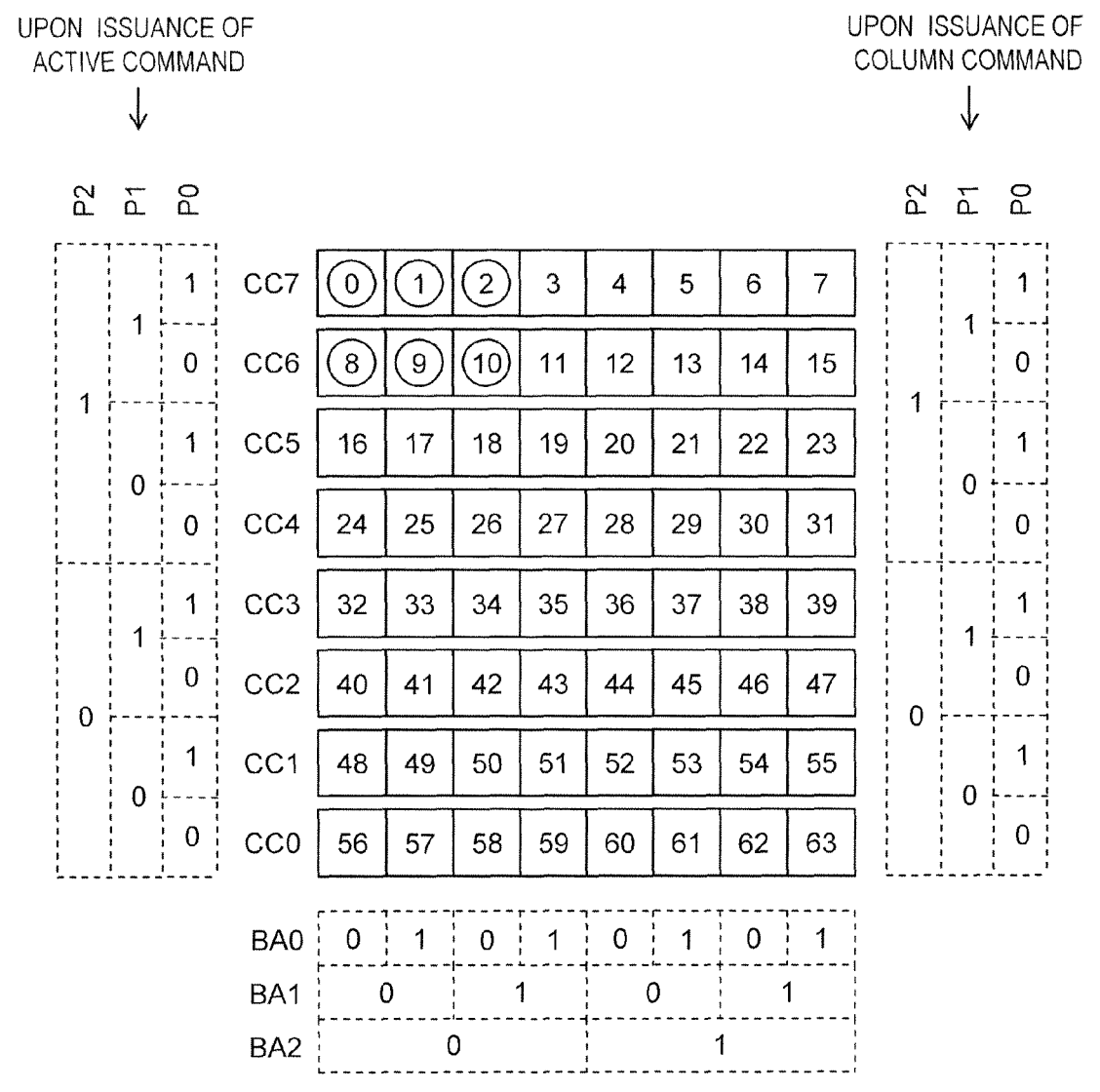

Turning to FIG. 10, the PRA-1 system is a system in which chip addresses SID (P2, P1, and P0), which are a part of the address signal, and the bank address signals BA0 to BA2 are supplied during both the row access and the column access, and the rank number is 1. In this system, the controller recognizes all banks as different banks. Specifically, the controller recognizes 64 banks in the present embodiment. Therefore, the number and the combination of the banks, which become the active state, is optional, wherein the maximum of 64 banks can be brought into the active state.

Figure 11:
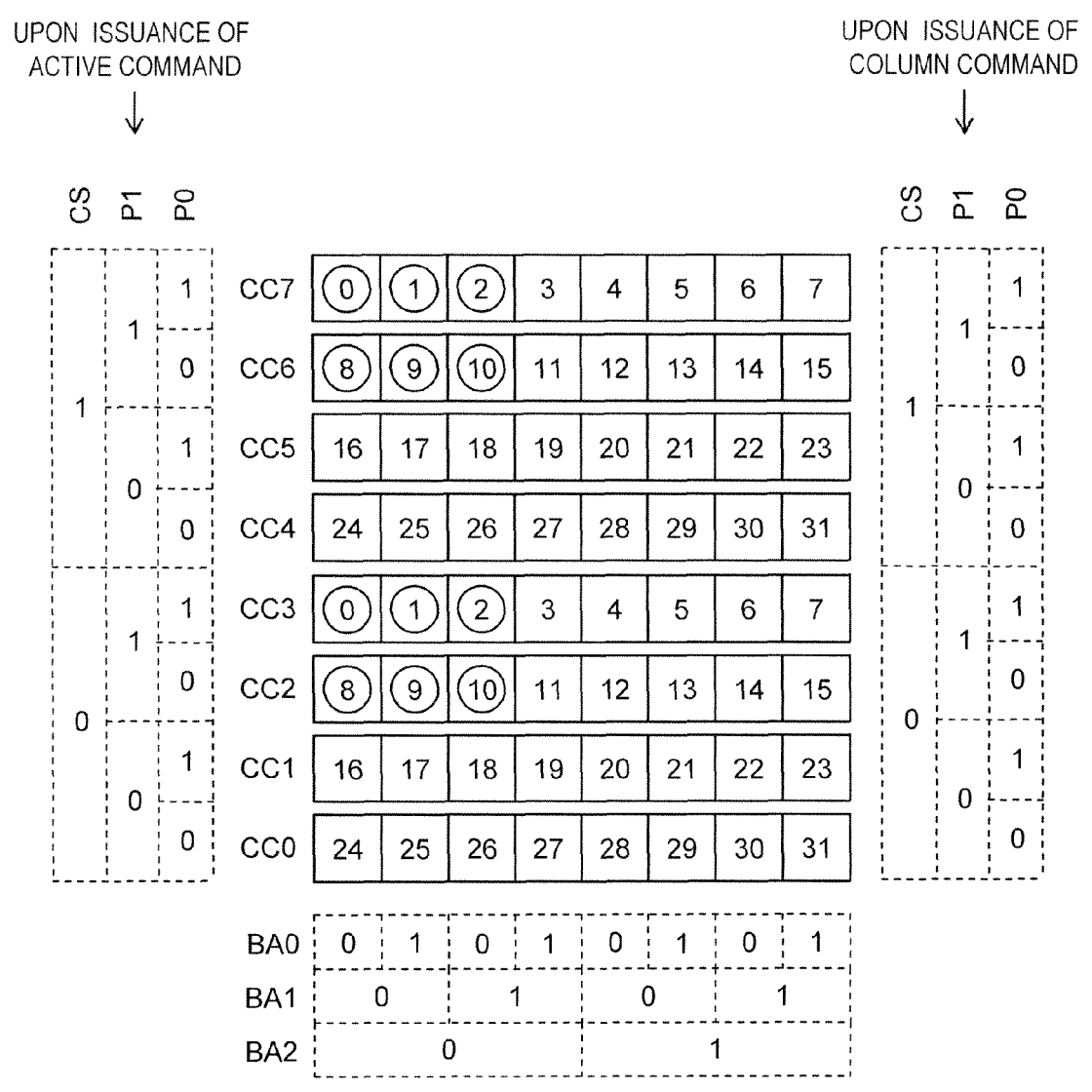

Turning to FIG. 11, the PRA-2 system is a system in which either the core chips CC0 to CC3 or the core chips CC4 to CC7 are selected based on the selection signals CS0 and CS1 of two bits, and a chip address SID (P0 and P1), which is a part of an address signal, and the bank address signals BA0 to BA2 are supplied at the time of both of a row access and a column access.

Because either the core chips CC0 to CC3 or the core chips CC4 to CC7 are selected using the chip selection signal in this system, the number of ranks as viewed from the controller is two. The controller recognizes the banks included in each rank as different banks. That is, in the present embodiment, the controller recognizes 32 banks per one rank. Therefore, the number and the combination of the banks, which become the active state, is optional, wherein the maximum of 32 banks per one rank can be brought into the active state.

The above description is the detail of the respective address allocation systems. The address allocation systems can be changed by the mode selection.

A specific circuit configuration of the semiconductor device 10 is explained next.

In the first embodiment, address allocation in the semiconductor device 10 is set to the PRA-1 system.

Figure 12:
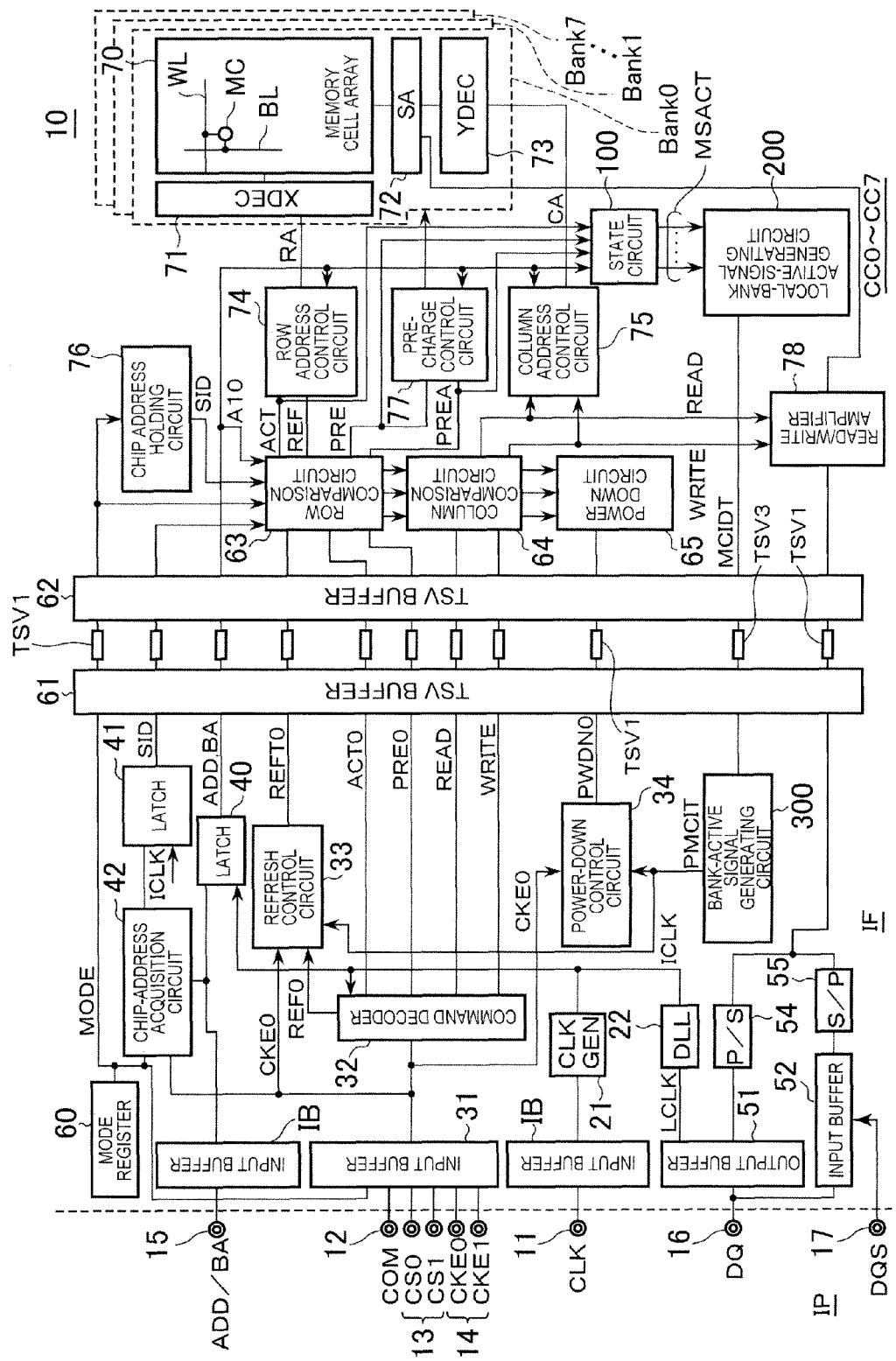
FIG. 12 is a block diagram indicative of an embodiment of a configuration of the semiconductor device 10 according to a first embodiment of the present invention.

Turning to FIG. 12, external terminals provided in the interposer IP include a clock terminal 11, a command terminal 12, chip select terminals 13, clock enable terminals 14, an address terminal 15, a data input/output terminal 16, and a data strobe terminal 17. Although other terminals such as a calibration terminal and a power supply terminal are also provided, they are not shown. All the external terminals other than the power supply terminal are connected to the interface chip IF and are not directly connected to the core chips CC0 to CC7.

The clock terminal 11 is a terminal to which an external clock signal CLK is supplied and the supplied external clock signal CLK is supplied to a clock generation circuit 21 through an input buffer IB. The clock generation circuit 21 generates an internal clock signal ICLK and the generated internal clock signal ICLK is supplied to various circuit blocks in the interface chip IF.

The internal clock signal ICLK is supplied to a DLL circuit 22. The DLL circuit 22 generates an output clock signal LCLK and the generated output clock signal LCLK is supplied to an output buffer circuit 51.

The command terminal 12 is a terminal to which a command signal COM including a row address strobe signal RASB, a column address strobe signal CASB, a write enable signal WEB, and the like is supplied. The chip select terminal 13 is a terminal to which the chip selection signals CS0 and CS1 are supplied. The clock enable terminal 14 is a terminal to which clock enable signals CKE0 and CKE1 are supplied. However, the chip selection signal CS1 and the clock enable signal CKE1 are not used because the number of ranks is one when the PRA-1 system is selected. These signals are used when the LRA-2 system or the PRA-2 system in which the number of ranks is two is selected. A case where the PRA-2 system is selected is explained later.

The command signal, the chip selection signals, and the clock enable signals are supplied to a command decoder 32 through an input buffer 31.

The command decoder 32 decodes the command signal COM output from the input buffer 31 to generate various internal signals. The internal signals output from the command decoder 32 include an active signal ACT0, a precharge signal PRE0, a read signal READ, and a write signal WRITE. When the LRA-2 system or the PRA-2 system is selected, the active signal and the precharge signal are generated with respect to each rank, which will be also explained later. These internal signals are supplied to the core chips CC0 to CC7 in common through a TSV buffer 61 and the through silicon vias TSV1. The read signal READ and the write signal WRITE are output from the command decoder 32 after a predetermined latency has elapsed in a latency counter (not shown). The latency for the read signal READ and the write signal WRITE is set in an additive latency AL. A value of the additive latency AL can be changed according to a set value in a mode register 60.

The internal signals generated by the command decoder 32 also include a refresh signal REF0. The refresh signal REF0 is generated when a combination of the command signal COM indicates a refresh command. The refresh signal REF0 is supplied to a refresh control circuit 33 shown in FIG. 12. The refresh control circuit 33 generates a refresh signal REFT0 based on the refresh signal REF0 and the clock enable signal CKE0. The refresh signal REFT0 is supplied to the core chips CC0 to CC7 in common through the TSV buffer 61 and the through silicon via TSV1.

The address terminal 15 is a terminal to which an address signal ADD and a bank address signal BA are supplied, and the supplied address signal ADD and bank address signal BA are supplied to an address latch circuit 40 and a chip-address acquisition circuit 42 through an input buffer IB.

The chip-address acquisition circuit 42 extracts or generates the chip address SID based on the bank address signal BA. Extraction of the chip address SID is performed when an operation mode in which the chip address SID is input at the time of a column access as in the PRA-1 system is selected, and the input chip address SID is extracted. Generation of the chip address SID is performed when an operation mode in which the chip address SID is not input at the time of a column access as in the LRA-1 system is selected, and the chip address SID is generated based on the bank address signal BA.

The chip address SID output from the chip-address acquisition circuit 42 is latched by a latch circuit 41 synchronously with the internal clock signal ICLK. The chip address SID latched by the latch circuit 41 is supplied to the core chips CC0 to CC7 in common through the TSV buffer 61, the through silicon via TSV, and a TSV buffer 62. The address latch circuit 40 latches the address signal ADD and another part of the bank address signal BA synchronously with the internal clock signal ICLK and supplies the latched signals to the core chips CC0 to CC7 in common through the TSV buffer 61, the through silicon vias TSV, and the TSV buffer 62.

The data input/output terminal 16 is a terminal for inputting or outputting read data DQ or write data DQ, and is connected to the output buffer circuit 51 and an input buffer circuit 52. The output buffer circuit 51 receives read data supplied through a parallel-serial converting circuit 54 and outputs the received read data to the data input/output terminal 16 synchronously with the output clock signal LCLK. The input buffer circuit 52 receives write data supplied through the data input/output terminal 16 and outputs the received write data to a serial-parallel converting circuit 55. The operation of the input buffer circuit 52 is performed synchronously with a data strobe DQS supplied through the data strobe terminal The parallel-serial converting circuit 54 converts parallel read data supplied from the core chips CC0 to CC7 through the through silicon vias TSV1 into serial data. The serial-parallel converting circuit 55 converts serial write data supplied from the input buffer circuit 52 into parallel data.

In this way, parallel data which are not converted into serial data are basically input or output between the core chips CC0 to CC7 and the interface chip IF. That is, while data input/output to/from outside of the chip is performed serially (that is, one data input/output terminal is used for one data DQ) in the normal SDRAM that operates alone, data input/output is performed in parallel between the core chips CC0 to CC7 and the interface chip IF. This point is an important difference between the normal SDRAM and the core chips CC0 to CC7. However, it is not essential to input/output all the prefetched parallel data using different through silicon vias TSV, respectively, and the number of through silicon vias TSV required for one data DQ can be reduced by performing partial parallel-serial conversion on the side of the core chips CC0 to CC7. For example, transfer of the read data or the write data between the interface chip IF and the core chips CC0 to CC7 can be performed in twice.

While the same through silicon vias TSV1 are used for the read data and the write data in the first embodiment, through silicon vias TSV1 dedicated for the read data and through silicon vias TSV1 dedicated for the write data can be also used. In this case, the read data and the write data are transferred through different signal paths and thus no conflict of the read data and the write data between ranks occurs, which enables to further reduce an issuance interval of column commands.

The interface chip IF further includes a power-down control circuit 34. The power-down control circuit 34 activates a power down signal PWDN0 when the clock enable signal CKE0 is deactivated to a low level. As shown in FIG. 12, the power down signal PWDN0 is supplied to the core chips CC0 to CC7 in common through the TSV buffer 61 and the through silicon via TSV1.

The interface chip IF further includes the mode register 60. Operation modes of the semiconductor device 10 according to the first embodiment are set in the mode register 60. The operation modes to be set include also discrimination of the address allocation methods, that is, the LRA-1 system, the LRA-2 system, the LRA-3 system, the PRA-1 system, and the PRA-2 system. A mode signal MODE which is an output of the mode register 60 is supplied to various circuit blocks and is also supplied to the core chips CC0 to CC7 through the through silicon via TSV. For example, the input buffer 31 enables the chip selection signal CS1 and the clock enable signal CKE1 when the mode signal MODE indicates the PRA-2 system, and disenables the chip selection signal CS1 and the clock enable signal CKE1 when the mode signal MODE indicates the PRA-1 system. The chip-address acquisition circuit 42 extracts a different part of the address signal ADD according to the address allocation method indicated by the mode signal MODE, and generates the chip address based thereon.

Figure 13:
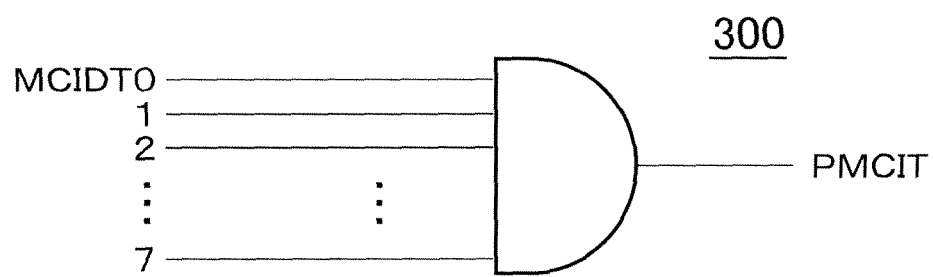
FIG. 13 is a circuit diagram indicative of an embodiment of a bank-active signal generating circuit 300.

The interface chip IF further includes a bank-active signal generating circuit 300. The bank-active signal generating circuit 300 receives local bank active signals MCIDT0 to MCIDT7 supplied from the core chips CC0 to CC7, respectively, and determines whether at least one of the local bank active signals MCIDT0 to MCIDT7 is at a low level. Therefore, an 8-input AND gate circuit that receives the local bank active signals MCIDT0 to MCIDT7 as shown in FIG. 13 can be used as the bank-active signal generating circuit 300.

While details of the local bank active signals MCIDT0 to MCIDT7 are explained later, the signals are at a low level when there is a bank in an active state in the corresponding core chips and the signals are at a high level when there is no bank in the active state in the corresponding core chips. Therefore, the fact that at least one of the local bank active signals MCIDT0 to MCIDT7 is at a low level means that at least one of the banks is in the active state in at least one of the core chips CC0 to CC7.

When at least one of the local bank active signals MCIDT0 to MCIDT7 is at a low level, the bank-active signal generating circuit 300 prohibits various operations that are not to be executed in the active state. These operations include a refresh operation and a power down operation. The bank-active signal generating circuit 300 activates a bank active signal PMCIT and supplies the activated bank active signal to the refresh control circuit 33 and the power-down control circuit 34 when at least one of the local bank active signals MCIDT0 to MCIDT7 is at a low level. When the bank active signal PMCIT is activated, the refresh control circuit 33 does not generate the refresh signal REFT0 even when the refresh signal REF0 is activated, and the power-down control circuit 34 does not generate the power down signal PWDN0 even when the clock enable signal CKE0 is deactivated.

The outline of the interface chip IF is as explained above. Circuit configurations of the core chips CC0 to CC7 are explained next.

As shown in FIG. 12, a memory cell array 70 included in each of the core chips CC0 to CC7 is divided into eight banks Bank0 to Bank7. A bank is a unit capable of individually receiving commands. In other words, each of the banks can operate independently of each other on a non-exclusive basis. In the memory cell array 70, a plurality of word lines WL and a plurality of bit lines BL intersect, and a memory cell MC is arranged at each intersection (only one word line WL, one bit line BL, and one memory cell MC are shown in FIG. 12) Selection of a word line WL is performed by a row decoder 71. The bit lines BL are connected to corresponding sense amplifiers in a sense circuit 72. Selection of a sense amplifier is performed by a column decoder 73.

A row address RA is supplied to the row decoder 71 through a row-address control circuit 74. To the row-address control circuit 74, the address signal ADD and the bank address signal BA are supplied through the through silicon via TSV1, and an active signal ACT and a refresh signal REF are also supplied from a row comparison circuit 63.

When the active signal ACT is activated, the row-address control circuit 74 supplies the address signal ADD to the row decoder 71 of a bank selected based on the bank address signal BA. This activates a specified word line WL in the specified bank. That is, a row access is performed. On the other hand, when the refresh signal REF is activated, the row-address control circuit 74 supplies a count value of a refresh counter (not shown) to the row decoders 71 of all the banks. This activates a specified word line WL in all the banks, thereby performing a refresh operation.

The row comparison circuit 63 also outputs precharge signals PRE and PREA. The precharge signals PRE and PREA are supplied to a precharge control circuit 77. The precharge control circuit 77 precharges a bank specified by the bank address signal BA when the precharge signal PRE is activated, and precharges all the banks when the precharge signal PREA is activated.

A column address CA is supplied to the column decoder 73 through a column-address control circuit 75. To the column-address control circuit 75, the address signal ADD and the bank address signal BA are supplied through the through silicon via TSV1, and the read signal READ and the write signal WRITE are also supplied from a column comparison circuit 64.

The column-address control circuit 75 supplies the address signal ADD to the column decoder 73 of a bank selected based on the bank address signal BA when the read signal READ or the write signal WRITE is activated. This connects a specified sense amplifier of the specified bank to a read/write amplifier 78. Therefore, when the read signal READ is activated, read data that is read from the memory cell array 70 through the sense circuit 72 is transferred to the interface chip IF through the read/write amplifier 78 and the through silicon via TSV1. When the write signal WRITE is activated, write data that is transferred from the interface chip IF through the through silicon via TSV1 is written in the memory cell array 70 through the read/write amplifier 78 and the sense circuit 72.

The row comparison circuit 63 compares a chip address SID(IF) supplied from the interface chip IF through the through silicon via TSV1 and a specific chip address SID (CORE) allocated to the corresponding one of the core chips CC0 to CC7 with each other, and activates the active signal ACT, the refresh signal REF, the precharge signal PRE, or the precharge signal PREA based on the active signal ACT0, the refresh signal REFT0, and the precharge signal PRE0 when both of the chip addresses coincide. The specific chip address SID(CORE) is held in a chip-address holding circuit 76. The chip-address holding circuits 76 are cascaded between the core chips CC0 to CC7 through the through silicon vias TSV2 of the type shown in FIG. 2B, which enables different chip addresses SID to be set in the respective core chips CC0 to CC7.

The column comparison circuit 64 compares the chip address SID(IF) supplied from the interface chip IF through the through silicon via TSV1 and the specific chip address SID(CORE) allocated to the corresponding one of the core chips CC0 to CC7 with each other, and activates the read signal READ or the write signal WRITE when both of the chip addresses coincide. Specifically, when the chip address SID(IF) and the chip address SID(CORE) coincide, the column comparison circuit 64 causes the read signal READ or the write signal WRITE supplied from the interface chip IF to pass through without processing and supplies the signal to the column-address control circuit 75 and the read/write amplifier 78.

Each of the core chips CC0 to CC7 also includes a power down circuit 65. The power down circuit 65 causes the corresponding core chip to enter a power down mode based on the chip address SID(IF), the chip address SID(CORE), and the power down signal PWDN0. Specifically, when the chip address SID(IF) and the chip address SID(CORE) coincide, the power down circuit 65 causes the corresponding core chip to enter the power down mode in response to the power down signal PWDN0.

Each of the core chips CC0 to CC7 further includes a state circuit 100. The state circuit 100 generates an active state MSACT based on the active signal ACT, the precharge signals PRE and PREA, and the bank address signal BA. The active state MSACT is composed of eight bits of states MSACT0 to MSACT7 corresponding to the banks Bank0 to Bank7, respectively, and is used as a signal for indicating which bank is currently in the active state. Specifically, the state circuit 100 activates one of the active states MSACT0 to MSACT7 corresponding to a bank indicated by the bank address signal BA when the active signal ACT is activated, and deactivates one of the active states MSACT0 to MSACT7 corresponding to a bank indicated by the bank address signal BA when the precharge signal PRE is activated. When the precharge signal PREA is activated, the state circuit 100 deactivates all the active states MSACT0 to MSACT7.

Figure 14:
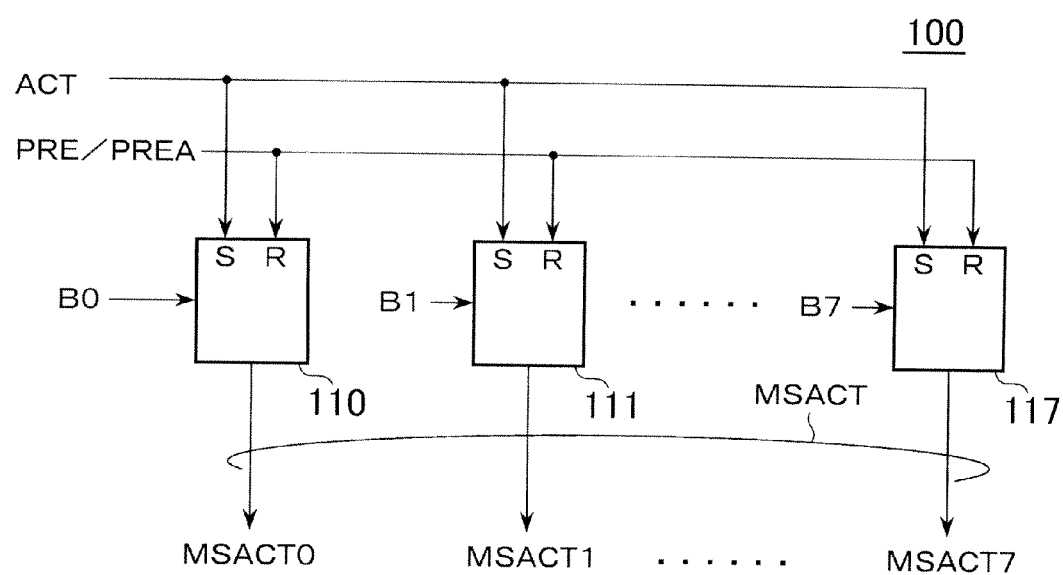
FIG. 14 is a circuit diagram indicative of an embodiment of a state circuit 100.

Turning to FIG. 14, the state circuit 100 includes eight latch circuits 110 to 117. The latch circuits 110 to 117 are activated by corresponding bank select signals B0 to B7, and the activated latch circuits 110 to 117 are set by the active signal ACT and reset by the precharge signal PRE. When the precharge signal PREA is activated, the latch circuits 110 to 117 are deactivated regardless of the bank select signals B0 to B7. Outputs from the latch circuits 110 to 117 are used as the active states MSACT0 to MSACT7, respectively. Accordingly, which bank is in the active state can be known by referring to the active states MSACT0 to MSACT7. The active state indicates a state where a word line WL has been selected based on the row address RA and, in this state, the read operation can be performed when the read signal is activated and the write operation can be performed when the write signal activated.

The active states MSACT0 to MSACT7 are supplied to a local-bank active-signal generating circuit 200 shown in FIG. 12. The local-bank active-signal generating circuit 200 receives the eight bits of active states MSACT0 to MSACT7 and determines whether at least one of the bits is activated.

Figure 15:
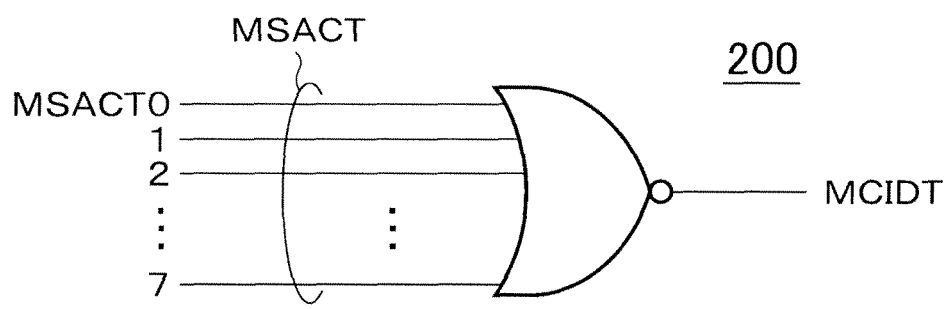
FIG. 15 is a circuit diagram indicative of an embodiment of a local-bank active-signal generating circuit 200.

Turning to FIG. 15, the local-bank active-signal generating circuit 200 includes an 8-input NOR gate circuit that receives the active states MSACT0 to MSACT7. With this configuration, the local bank active signal MCIDT becomes a low level when at least one of the active states MSACT0 to MSACT7 is activated to a high level. On the other hand, when all of the active states MSACT0 to MSACT7 are deactivated to a low level, the local bank active signal MCIDT becomes a high level.

The local bank active signals MCIDT are supplied from the core chips CC0 to CC7 to the interface chip IF through the through silicon vias TSV3. The through silicon vias TSV3 are of the type shown in FIGS. 2C and 5 and can form separate signal paths between the interface chip IF and the core chips CC0 to CC7 with the cyclic connection between the core chips as explained with reference to FIG. 6.

Figure 16:
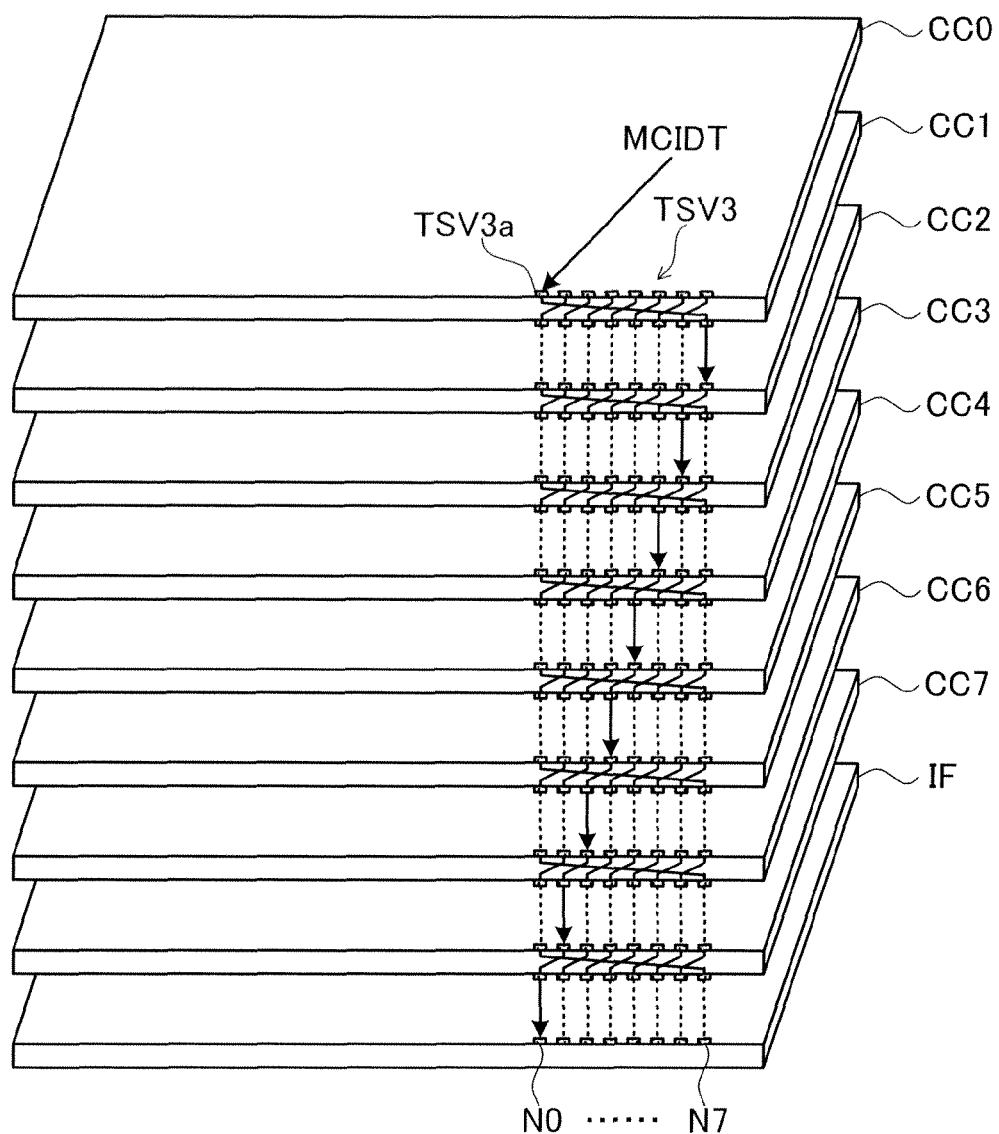
FIG. 16 is a schematic diagram for explaining a connection relation between the through silicon vias TSV3 for transmitting local bank active signals MCIDT0 to MCIDT7.

Turning to FIG. 16, eighth through silicon vias TSV3 are used in each of the core chips CC0 to CC7 to transmit the local bank active signals MCIDT0 to MCIDT7, and the local bank active signals MCIDT0 to MCIDT7 are supplied to leftmost through silicon vias TSV3a. This causes the local bank active signal MCIDT0 output from the uppermost core chip CC0, for example, to be passed through the through silicon vias TSV3 provided at different plan positions in the core chips CC0 to CC7 and to be finally supplied to an input node N0 on the interface chip IF. The same is true for the other core chips CC1 to CC7. In this way, the local bank active signals MCIDT0 to MCIDT7 output from the core chips CC0 to CC7 are supplied to the input nodes N0 to N7 on the interface chip IF, respectively.

The circuit configurations of the core chips CC0 to CC7 are as explained above. Operations of the semiconductor device 10 according to the first embodiment are explained next.

Figure 17:
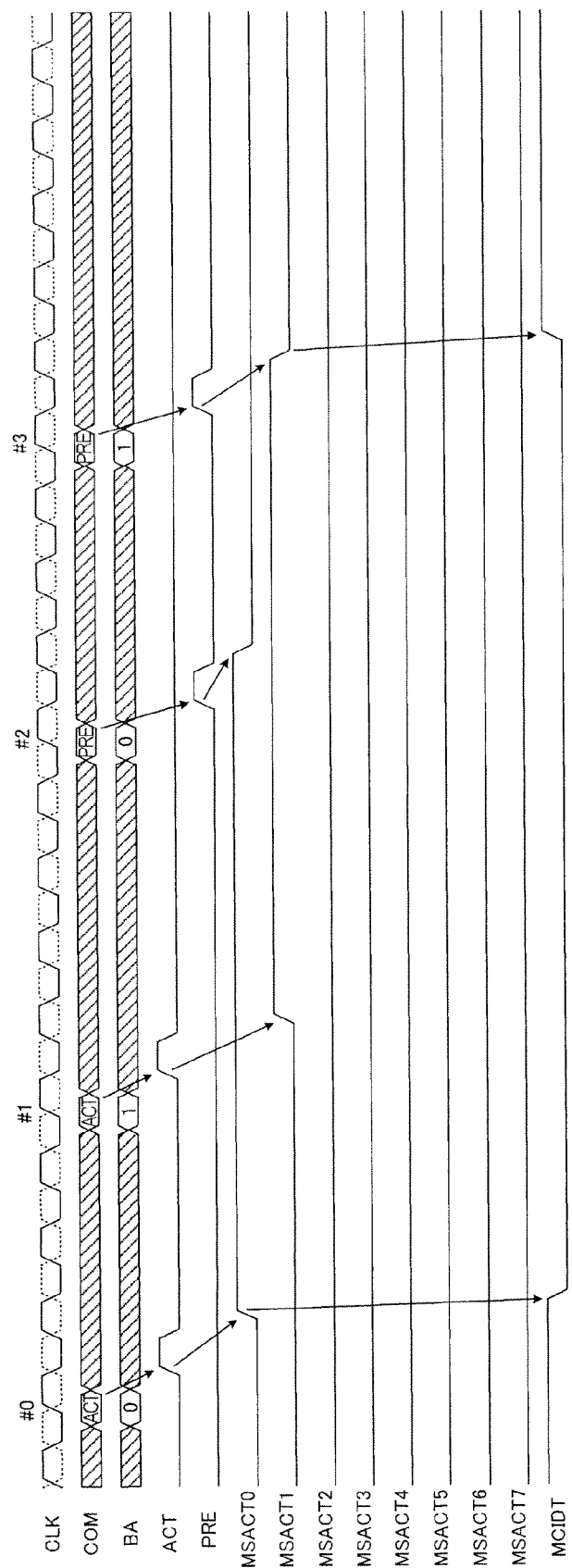
FIG. 17 is a timing chart for explaining operations of the state circuit 100 and the local-bank active-signal generating circuit 200, and indicative of an embodiment of an operation common to core chips CC0 to CC7.

Turning to FIG. 17, an active command is issued synchronously with active edges #0 and #1 of the external clock signal CLK, and a precharge command is issued synchronously with active edges #2 and #3. The bank Bank0 is specified by the bank address signal BA at the time of command issuance corresponding to the active edges #0 and #2, and the bank Bank1 is specified by the bank address signal BA at the time of command issuance corresponding to the active edges #1 and #3. As described above, the row comparison circuit 63 in a selected core chip generates the active signal ACT when the active command is issued, and the row comparison circuit 63 in a selected core chip generates the precharge signal PRE when the precharge command is issued.

When the active command is issued in response to the active edges #0 and #1, the active states MSACT0 and MSACT1 are activated in turn to a high level. When the active state MSACT0 is activated, the local bank active signal MCIDT changes to a low level.

When the precharge command is then issued in response to the active edges #2 and #3, the active states MSACT0 and MSACT1 are deactivated in turn to a low level. As a result, when the active state MSACT1 is deactivated, the local bank active signal MCIDT returns to a high level.

In this way, the local bank active signal MCIDT becomes a low level when one of the banks included in the corresponding core chip is in the active state, and becomes a high level when all the banks included in the corresponding core chip are in the inactive states. The local bank active signal MCIDT thus generated is supplied to the interface chip IF through the through silicon via TSV3.

Figure 18:
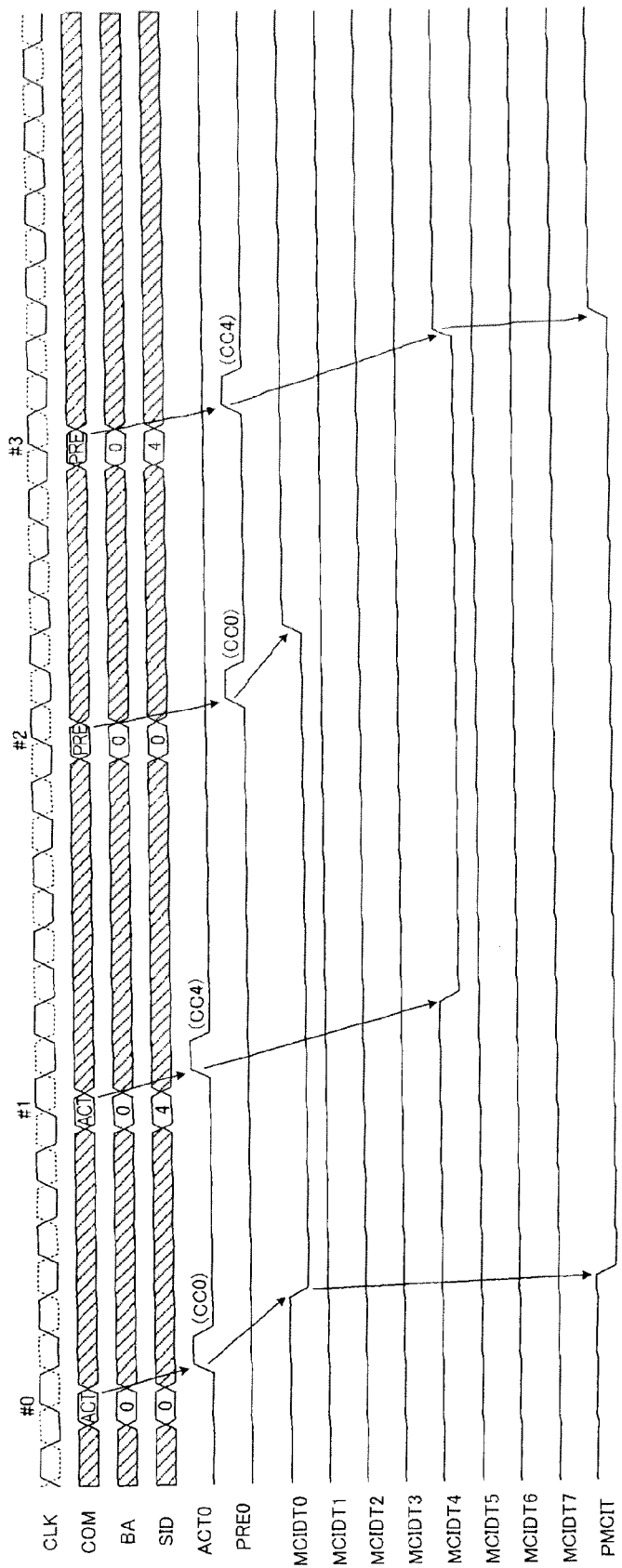
FIG. 18 is a timing chart for explaining an operation of a bank-active signal generating circuit 300.

Turning to FIG. 18, also in this example, an active command is issued synchronously with the active edges #0 and #1 of the external clock signal CLK, and a precharge command is issued synchronously with the active edges #2 and #3. The core chip CC0 is specified by the chip address SID at the time of command issuance corresponding to the active edges #0 and #2, and the core chip CC4 is specified by the chip address SID at the time of command issuance corresponding to the active edges #1 and #3. The bank address signal BA always specifies the bank Bank0.

When the active command is issued in response to the active edge #0, the local bank active signal MCIDT0 output from the core chip CC0 changes to a low level. When the local bank active signal MCIDT0 becomes a low level, the bank active signal PMCIT changes to a low level. When the active command is then issued in response to the active edge #1, the local bank active signal MCIDT4 output from the core chip CC4 changes to a low level.

When the precharge command is then issued in response to the active edges #2 and #3, the local bank active signals MCIDT0 and MCIDT4 change in turn to a high level. As a result, when the local bank active signal MCIDT4 becomes a high level, the bank active signal PMCIT returns to a high level.

In this way, the bank active signal PMCIT becomes a low level when any of the banks included in one of the core chips CC0 to CC7 is in the active state, and becomes a high level when all the banks included in all the core chips CC0 to CC7 are in the inactive states. The bank active signal PMCIT thus generated is supplied to the refresh control circuit 33, the power-down control circuit 34, and the like as shown in FIG. 12, and guards against commands that are not to be executed in the active state.

As described above, in the first embodiment, whether there is a bank in the active state is determined on the side of the core chips, and the local bank active signals MCIDT0 to MCIDT7 consequently obtained are processed on the side of the interface chip IF. This greatly reduces the circuit scale of the bank-active signal generating circuit 300 provided on the side of the interface chip IF. Furthermore, it is unnecessary to provide means for storing which bank is in the active state on the side of the interface chip IF. While the state circuit 100 and the local-bank active-signal generating circuit 200 are required on the side of the core chips CC0 to CC7 instead, increase in the circuit scale caused in the individual core chips CC0 to CC7 can be reduced to a minimum because these circuits merely process the eight bits of active states MSACT0 to MSACT7.

Figure 19:
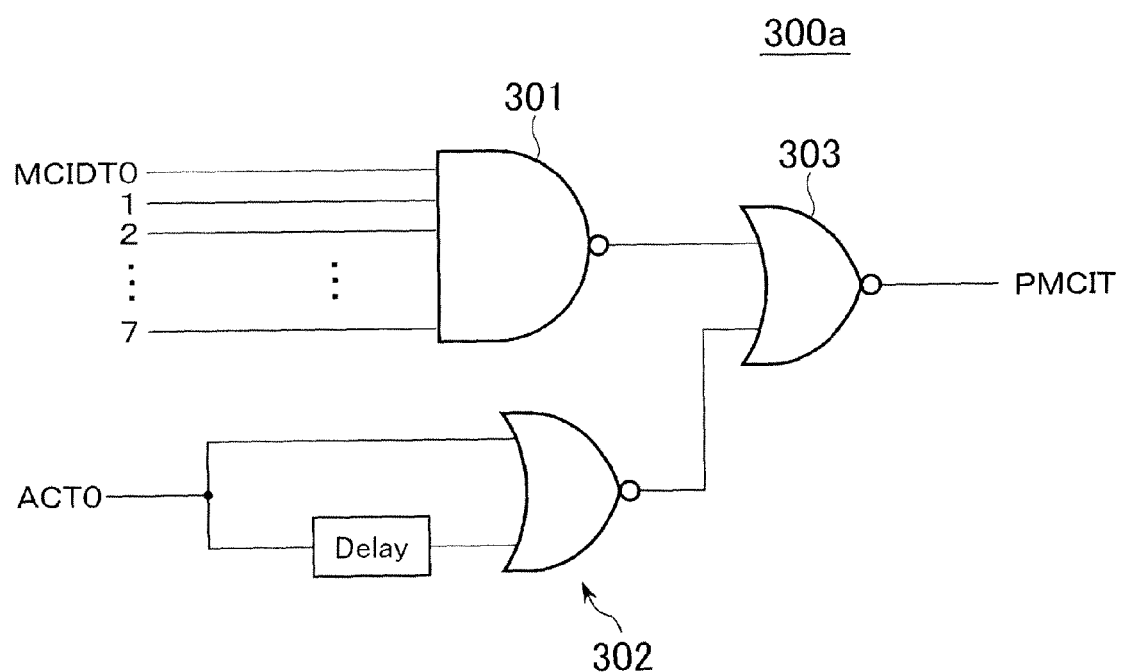
FIG. 19 is a circuit diagram indicative of an embodiment of a bank-active signal generating circuit 300a according to a modification of the first embodiment.

Turning to FIG. 19, the bank-active signal generating circuit 300a includes an 8-input NAND gate circuit 301 that receives the local bank active signals MCIDT0 to MCIDT7, a pulse-width extending circuit 302 that extends a pulse width of the active signal ACT0 as a one-shot pulse, and a NOR gate circuit 303 that receives outputs of the NAND gate circuit 301 and the pulse-width extending circuit 302.

Figure 20:
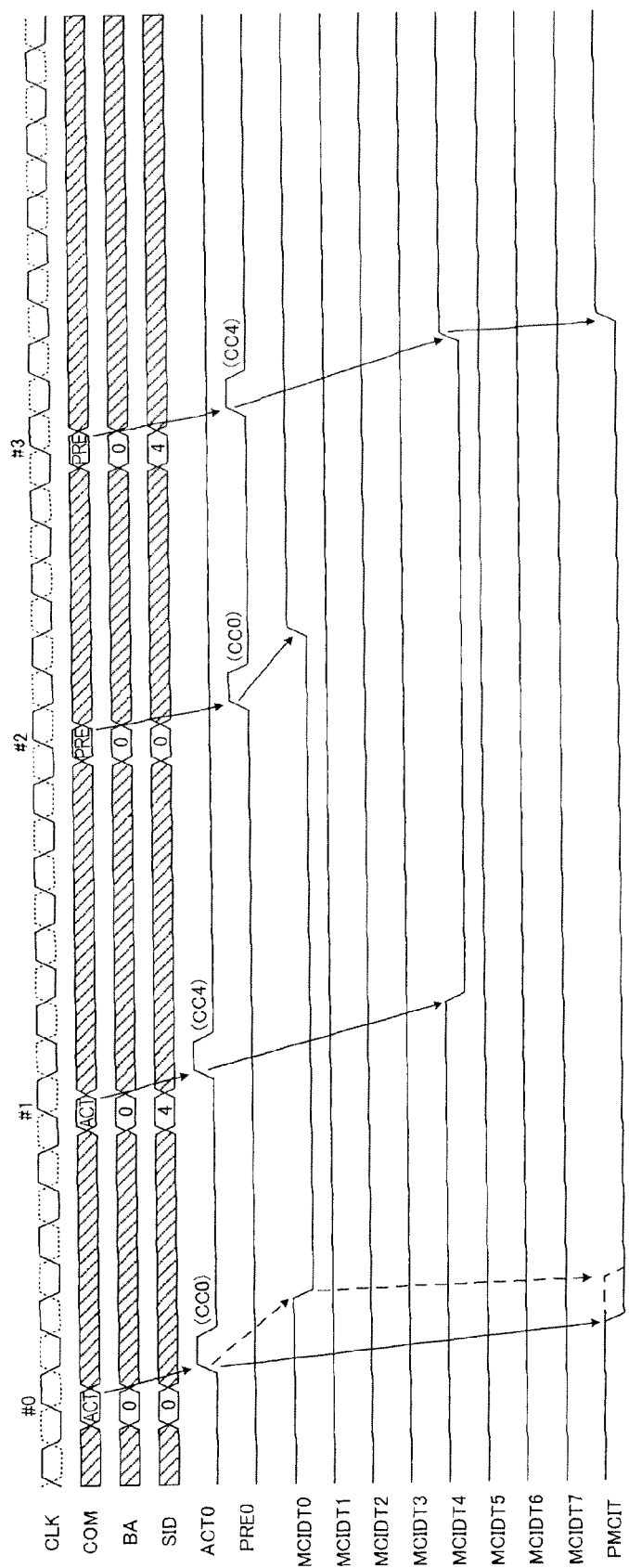
FIG. 20 is a timing chart for explaining an operation performed when the bank-active signal generating circuit 300a is used, wherein commands and addresses issued are the same as those in the example shown in FIG. 18.

Turning to FIG. 20, in the present modification, an active command is issued synchronously with the active edge #0 of the external clock signal CLK, and the bank active signal PMCIT immediately changes to a low level when the active signal ACT0 is generated inside of the interface chip IF. That is, the active signal ACT0 is supplied to the core chips CC0 to CC7 through the through silicon via TSV1 and accordingly the bank active signal PMCIT can be temporarily changed to a low level before the local bank active signal MCIDT is supplied from the selected core chip through the through silicon via TSV3.

That is, because the semiconductor device 10 according to the first embodiment is of the stacked type, there is a certain amount of time lag from when the active signal ACT0 is generated in the interface chip IF until when the local bank active signal MCIDT is supplied. Accordingly, the timing when the bank active signal PMCIT changes to a low level becomes later than that in the normal semiconductor memory with a one-chip configuration, and improper commands such as the refresh command may be executed in some cases. In contrast, when the bank-active signal generating circuit 300a is used as in the present modification, the bank active signal PMCIT immediately changes to a low level upon issuance of the active command, which solves the above problem. Therefore, it suffices to design an amount of extension by the pulse-width extending circuit 302 in view of the time lag.

A second embodiment of the present invention is explained next.

In the second embodiment, a case where the address allocation is set to the PRA-2 system is explained. When the address allocation is set to the PRA-2 system, the eight core chips CC0 to CC7 are divided into two ranks having the same address space, and each rank is independently selected by the chip selection signals CS0 or CS1. When the address allocation is set to the PRA-2 system, the four core chips CC0 to CC3 constitute a rank 0 and the remaining four core chips CC4 to CC7 constitute a rank 1 as shown in FIG. 21A.

Figure 22:
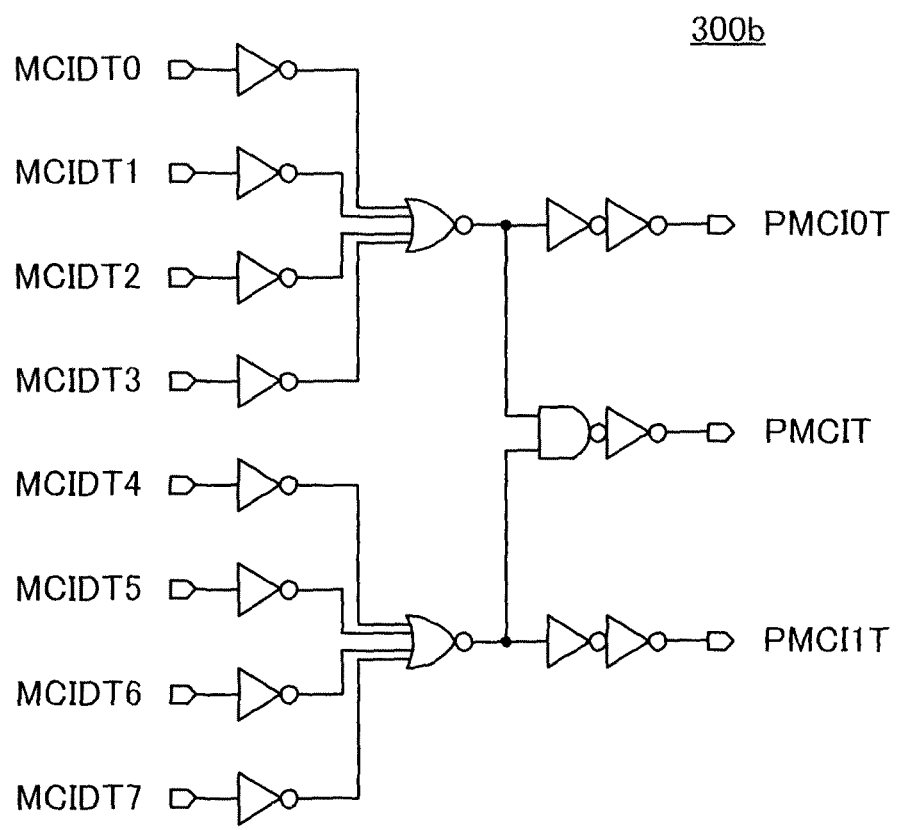
FIG. 22 is a circuit diagram indicative of an embodiment of a bank-active signal generating circuit 300b used in a second embodiment.

Turning to FIG. 22, the bank-active signal generating circuit 300b is a logic circuit that receives the local bank active signals MCIDT0 to MCIDT7 and generates bank active signals PMCIT, PMCI0T, and PMCI1T. To explain a specific operation, the bank active signal PMCIT becomes a low level when at least one of the local bank active signals MCIDT0 to MCIDT7 is at a low level, and the bank active signal PMCIT becomes a high level when all of the local bank active signals MCIDT0 to MCIDT7 are at a high level. This point is the same as that in the bank-active signal generating circuit 300 explained above.

In addition, in the bank-active signal generating circuit 300b shown in FIG. 22, the bank active signal PMCI0T becomes a low level when at least one of the local bank active signals MCIDT0 to MCIDT3 corresponding to the rank 0 is at a low level, and the bank active signal PMCI0T becomes a high level when all of the local bank active signals MCIDT0 to MCIDT3 are at a high level. Similarly, the bank active signal PMCI1T becomes a low level when at least one of the local bank active signals MCIDT4 to MCIDT7 corresponding to the rank 1 is at a low level, and the bank active signal PMCI1T becomes a high level when all of the local bank active signals MCIDT4 to MCIDT7 are at a high level.

With this operation, when the address allocation is set to the PRA-2 system, the bank active signals PMCI0T and PMCI1T can be generated with respect to each rank, which enables the guard against improper commands such as the refresh command to be performed with respect to each rank. Of course, when the address allocation is set to the PRA-1 system, it suffices to perform the same control as in the first embodiment using the bank active signal PMCIT.

Figure 23:
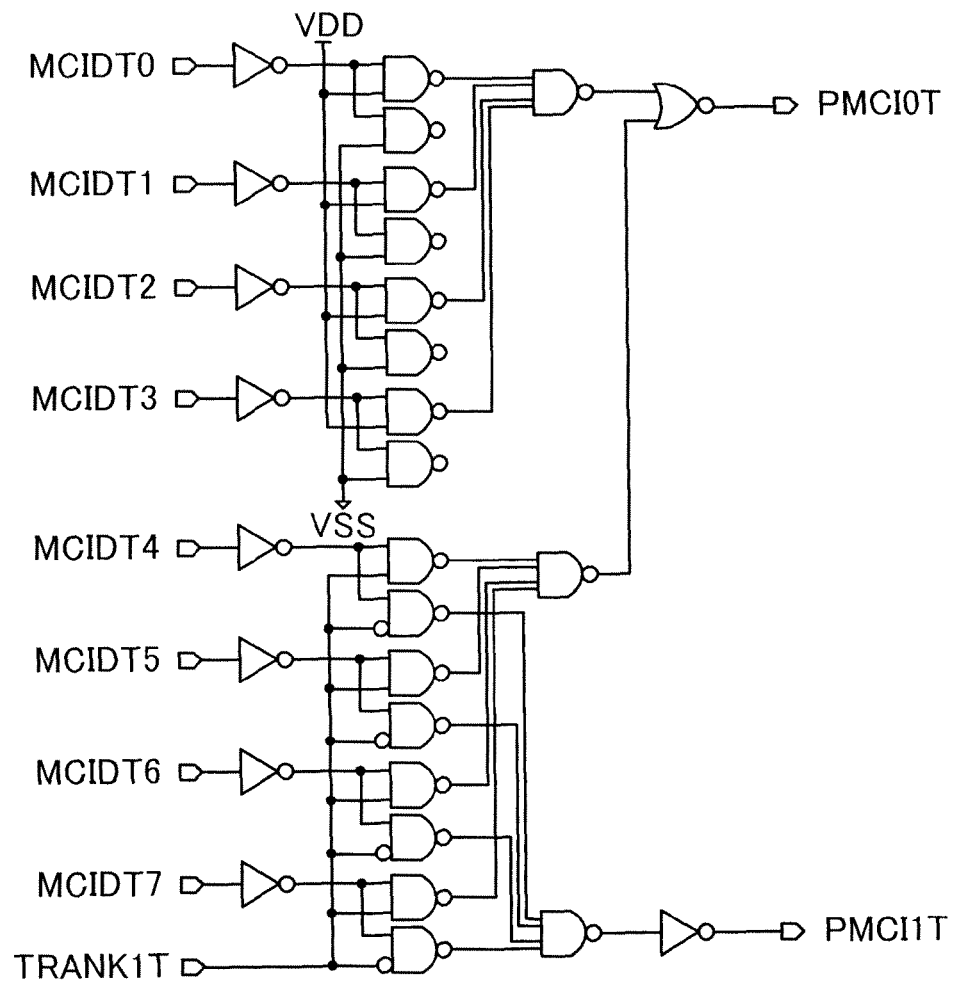
FIG. 23 is a circuit diagram indicative of an embodiment of a bank-active signal generating circuit 300c according to a modification of the second embodiment.

Turning to FIG. 23, the bank-active signal generating circuit 300c has different logic from that in the bank-active signal generating circuit 300b shown in FIG. 22 in that the bank active signal PMCI0T doubles as the bank active signal PMCIT. A rank signal TRANK1T which is a part of the mode signal MODE is supplied to the bank-active signal generating circuit 300c. The rank signal TRANK1T becomes a high level when the address allocation is set to the PRA-1 system and becomes a low level when the address allocation is set to the PRA-2 system.

Accordingly, the bank active signal PMCI0T can be used as the bank active signal PMCIT when the address allocation is set to the PRA-1 system. When the address allocation is set to the PRA-2 system, it suffices to use the bank active signal PMCI0T or PMCI1T with respect to each rank.

Figure 24:
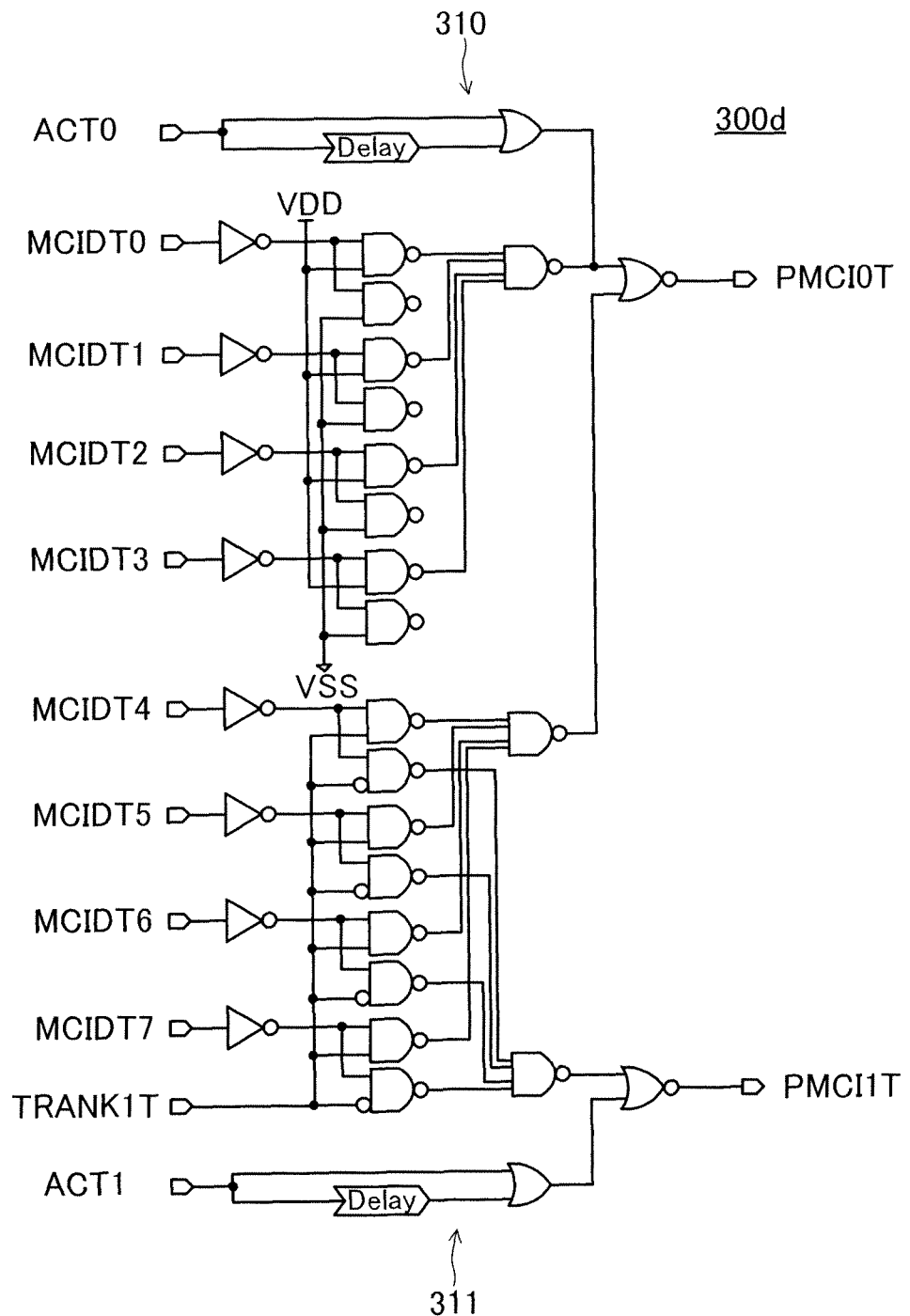
FIG. 24 is a circuit diagram indicative of an embodiment of a bank-active signal generating circuit 300d according to another modification of the second embodiment.

Turning to FIG. 24, the bank-active signal generating circuit 300d is different from the bank-active signal generating circuit 300c shown in FIG. 23 in that pulse-width extending circuits 310 and 311 that extend pulse widths of active signals ACT0 and ACT1, respectively, are added. Other logic is the same as that in the bank-active signal generating circuit 300c shown in FIG. 23. The active signal ACT0 is activated in response to an active command when the PRA-1 system is set, and activated in response to an active command specifying the rank 0 when the PRA-2 system is set. On the other hand, the active signal ACT1 is activated in response to an active command specifying the rank 1 when the PRA-2 system is set.

Figure 25:
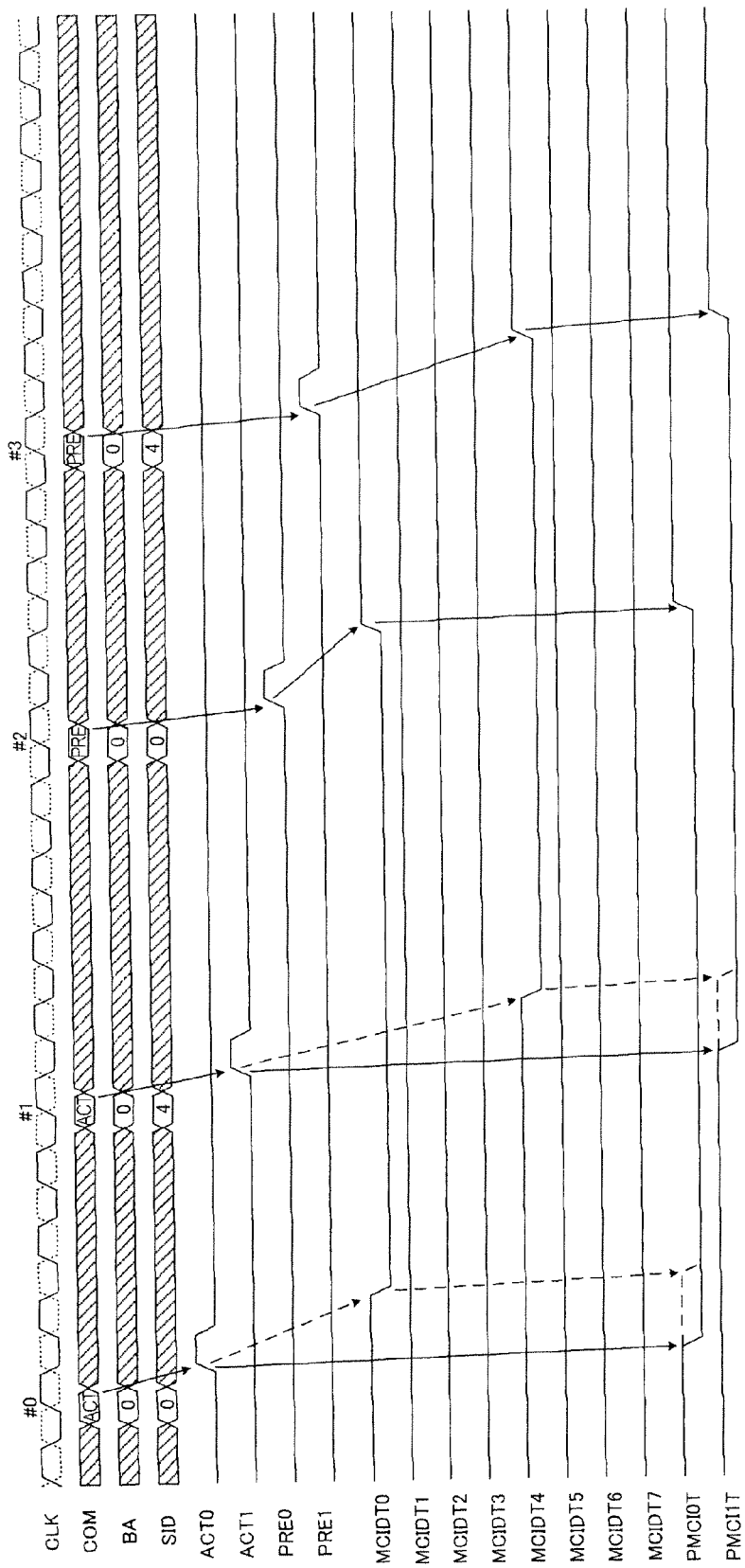
FIG. 25 is a timing chart for explaining an operation performed when the bank-active signal generating circuit 300d is used, wherein commands and addresses issued are the same as those in the example shown in FIG. 18.

Turning to FIG. 25, in the present modification, when an active command specifying the rank 0 is issued synchronously with the active edge #0 of the external clock signal CLK, the active signal ACT0 is generated inside of the interface chip IF, and then the bank active signal PMCI0T corresponding to the rank 0 immediately changes to a low level. When an active command specifying the rank 1 is issued synchronously with the active edge #1 of the external clock signal CLK, the active signal ACT1 is generated inside of the interface chip IF, and then the bank active signal PMCI1T corresponding to the rank 1 immediately changes to a low level. The significance is as explained with reference to FIG. 20.

When a precharge command specifying the rank 0 is issued synchronously with the active edge #2 of the external clock signal CLK, the local bank active signal MCIDT0 changes to a high level and thus the bank active signal PMCI0T corresponding to the rank 0 also returns to a high level. Similarly, when a precharge command specifying the rank 1 is issued synchronously with the active edge #3 of the external clock signal CLK, the local bank active signal MCIDT4 changes to a high level and thus the bank active signal PMCI1T corresponding to the rank 1 also returns to a high level.

As described above, in the second embodiment, when the address allocation is set to the PRA-2 system, the bank active signal PMCI0T or PMCI0T can be generated with respect to each rank, which enables the guard against improper commands to be performed with respect to each rank.

A third embodiment of the present invention is explained next.

In the third embodiment, cases where only some of the core chips CC0 to CC7 are used are explained. For example, when some of the eight core chips CC0 to CC7 have defects, the semiconductor device 10 can be handled as a non-defective product by using the remaining core chips that properly operate, without regarding the entire semiconductor device 10 as a defective product and discarding the semiconductor device 10. The third embodiment assumes these cases.

FIGS. 21B and 21C are schematic diagrams for explaining division into ranks performed when only four of the eight core chips CC0 to CC7 are used, and FIGS. 21D to 21G are schematic diagrams for explaining division into ranks performed when only two of the eight core chips CC0 to CC7 are used. Core chips hatched in FIGS. 21A to 21G are those that are not used. The core chips that are not used are not always defective core chips. For example, when only one core chip is defective, control becomes complicated if the remaining seven core chips are all used. In this case, it is conceivable that the defective core chip and normally-functioning three core chips are not used, thereby configuring the product with four core chips. In this way, when the number of core chips to be used is set to a power of 2, the control does not become complicated.

The example shown in FIG. 21B represents a case where the core chips CC0 to CC3 are used and, when the address allocation is set to the PRA-2 system, the core chips CC0 and CC1 constitute the rank 0 and the core chips CC2 and CC3 constitute the rank 1. The example shown in FIG. 21C represents a case where the core chips CC4 to CC7 are used and, when the address allocation is set to the PRA-2 system, the core chips CC4 and CC5 constitute the rank 0 and the core chips CC6 and CC7 constitute the rank 1.

The example shown in FIG. 21D represents a case where the core chips CC0 and CC1 are used and, when the address allocation is set to the PRA-2 system, the core chip CC0 constitutes the rank 0 and the core chip CC1 constitutes the rank 1. The example shown in FIG. 21E represents a case where the core chips CC2 and CC3 are used and, when the address allocation is set to the PRA-2 system, the core chip CC2 constitutes the rank 0 and the core chip CC3 constitutes the rank 1. The example shown in FIG. 21F represents a case where the core chips CC4 and CC5 are used and, when the address allocation is set to the PRA-2 system, the core chip CC4 constitutes the rank 0 and the core chip CC5 constitutes the rank 1. The example shown in FIG. 21G represents a case where the core chips CC6 and CC7 are used and, when the address allocation is set to the PRA-2 system, the core chip CC6 constitutes the rank 0 and the core chip CC7 constitutes the rank 1.

Figure 26:
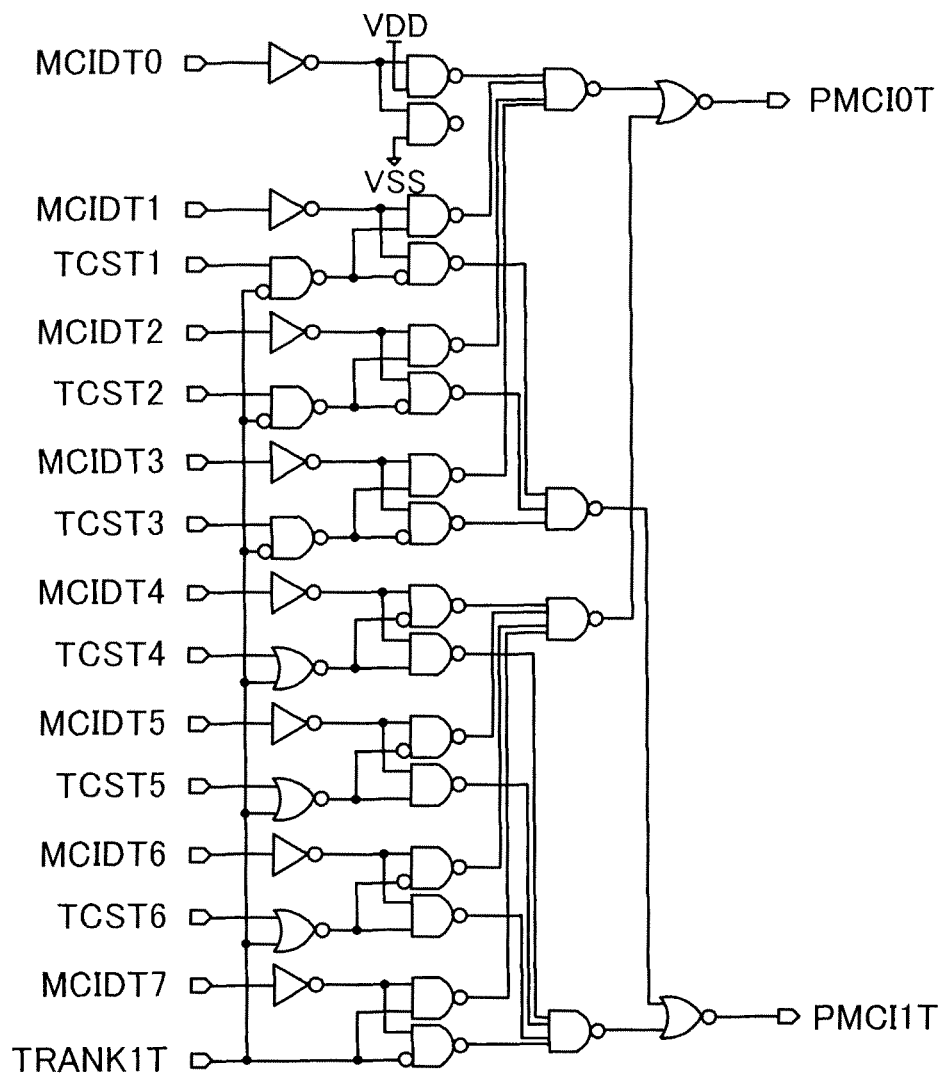
FIG. 26 is a circuit diagram indicative of an embodiment of a bank-active signal generating circuit 300e used in a third embodiment.

Turning to FIG. 26, the bank-active signal generating circuit 300e is different from the bank-active signal generating circuit 300c shown in FIG. 23 in that logic for receiving rank switching signals TCST1 to TCST6 is added. Other logic is the same as that in the bank-active signal generating circuit 300c shown in FIG. 23. The rank switching signals TCST1 to TCST6 correspond to the core chips CC1 to CC6, respectively, and ranks to which the corresponding core chips belong can be switched by setting the signals to a high level.

When all of the core chips CC0 to CC7 are used as shown in FIG. 21A, the core chips CC0 to CC3 constitute the rank 0 and the core chips CC0 to CC7 constitute the rank 1 when the address allocation is set to the PRA-2 system. Based on this state, the rank to which the core chips CC2 and CC3 belong needs to be changed from the rank 0 to the rank 1 when the core chips are to be used in the state shown in FIG. 21B. Similarly, when the core chips are to be used in the state shown in FIG. 21C, the rank to which the core chips CC4 and CC5 belong needs to be changed from the rank 1 to the rank 0. When the core chips are to be used in the state shown in FIG. 21D or 21E, the rank to which the core chip CC1 or CC3 belongs needs to be changed from the rank 0 to the rank 1. Similarly, when the core chips are to be used in the state shown in FIG. 21F or 21G, the rank to which the core chip CC4 or CC6 belongs needs to be changed from the rank 1 to the rank 0.

When such a change of the rank needs to be performed, the rank switching signals TCST1 to TCST6 corresponding to the target core chips are activated to a high level. This enables the address allocation to be set to the PRA-2 system and also enables the guard against improper commands to be performed with respect to each rank, even when only some of the core chips CC0 to CC7 are used.

The reason why the rank switching signals corresponding to the core chips CC0 and CC7 are unnecessary is because the ranks of the uppermost core chip CC0 and the lowermost core chips CC7 never change in any of the cases shown in FIGS. 21A to 21G.

Figure 27:
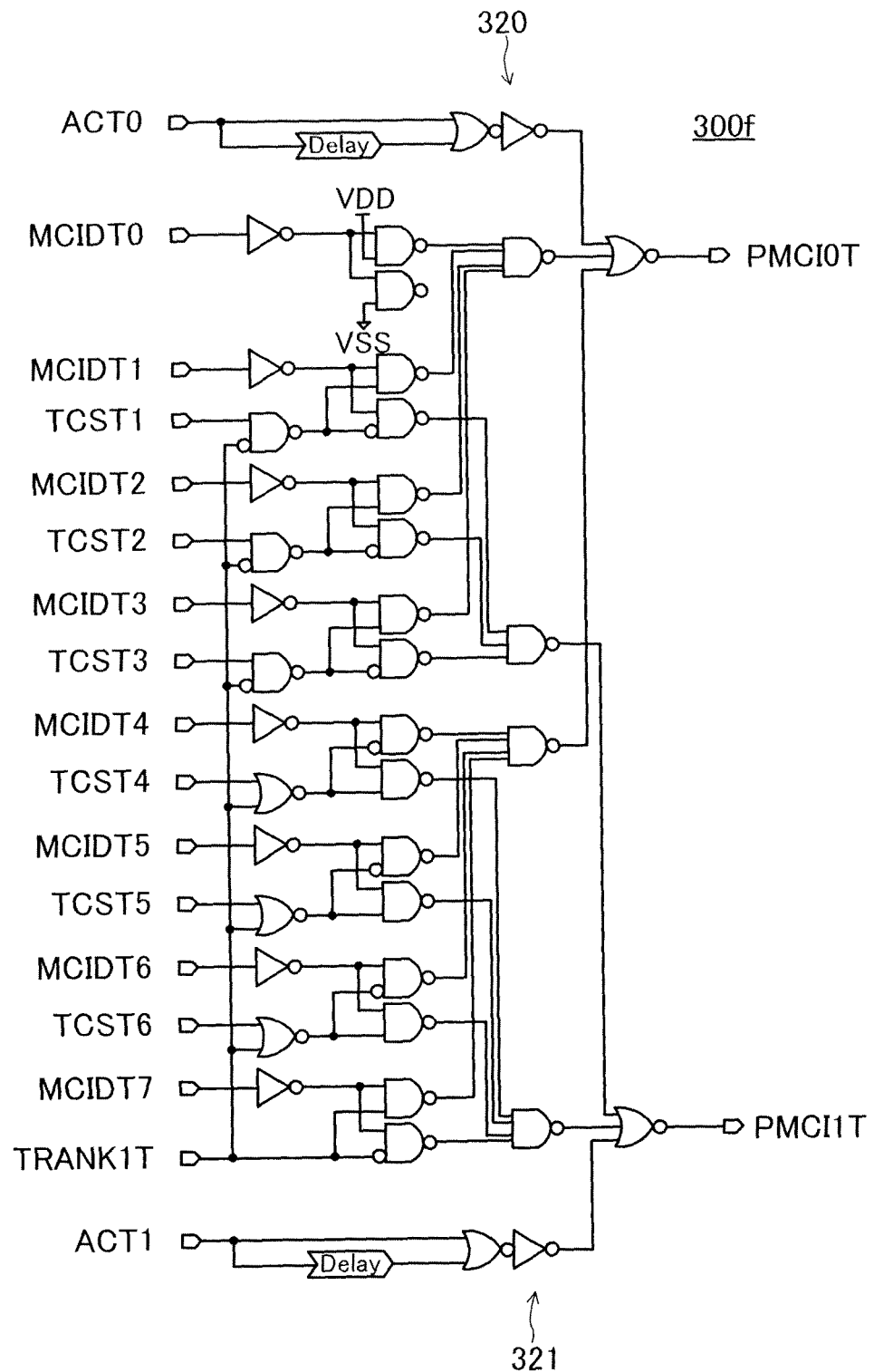
FIG. 27 is a circuit diagram of a bank-active signal generating circuit 300f according to a modification of the third embodiment.

Turning to FIG. 27, the bank-active signal generating circuit 300f is different from the bank-active signal generating circuit 300e shown in FIG. 26 in that pulse-width extending circuits 320 and 321 that extend pulse widths of the active signals ACT0 and ACT1, respectively, are added. Other logic is the same as that in the bank-active signal generating circuit 300e shown in FIG. 26. The significance of using the pulse-width extending circuits 320 and 321 is as explained with reference to FIG. 20, and the timing of changing the bank active signal PMCI0T or PMCI1T to a low level after issuance of an active command can be made earlier.

Figure 28:
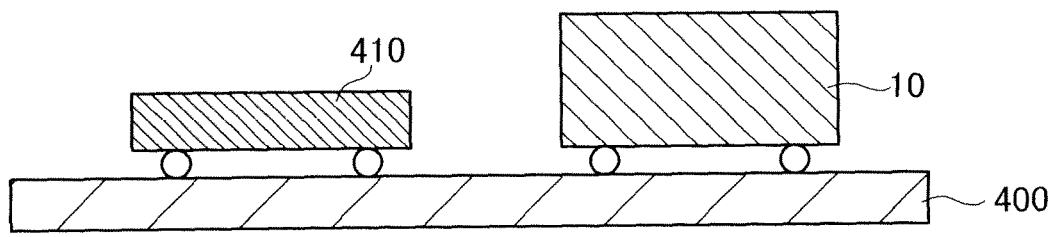
FIG. 28 is a schematic cross-sectional view of a configuration of a data processing system using the semiconductor device 10 according to the third embodiment.

Turning to FIG. 28, the data processing system has a configuration in which the semiconductor device 10 and a memory controller 410 that controls the semiconductor device 10 are mounted on a main substrate 400. While the semiconductor device 10 is directly mounted on the main substrate 400 in an example shown in FIG. 28, it is possible that a socket is provided on the main substrate 400 and a module substrate having the semiconductor device 10 mounted thereon is plugged into the socket. In this case, a plurality of the semiconductor devices 10 can be mounted on the module substrate.

It is apparent that the present invention is not limited to the above embodiments, but may be modified and changed without departing from the scope and spirit of the invention.

What is claimed is:

1. A semiconductor device comprising:
   a first chip outputting a bank address signal and an active signal; and a plurality of second chips stacked on the first chip, each of the second chips including a plurality of memory banks each selected based on the bank address signal, selected one or ones of the memory banks being brought into an active state in response to the active signal, wherein each of the second chips activates a local bank active signal when at least one of the memory banks included therein is in the active state, and the first chip activates a bank active signal when at least one of the local bank active signals is activated, wherein each of the second chips includes a substrate and a plurality of penetration electrodes penetrating through the substrate, the penetration electrodes including a plurality of first penetration electrodes and a plurality of second penetration electrodes, the bank address signal and the active signal are supplied from the first chip to the second chips via the first penetration electrodes, and the local bank active signals are supplied from the second chips to the first chip via the second penetration electrodes.

2. The semiconductor device as claimed in claim 1, wherein each of the first penetration electrodes provided on one of the second chips is short-circuited to an associated one or ones of the first penetration electrodes located at a same planar position as viewed from a stacking direction provided on other of the second chips.

3. The semiconductor device as claimed in claim 1, wherein each of the second penetration electrodes provided on one of the second chips is not short-circuited to an associated one or ones of the second penetration electrodes located at a same planar position as viewed from a stacking direction provided on other of the second chips.

4. The semiconductor device as claimed in claim 3, wherein each of the second penetration electrodes provided on the one of the second chips is short-circuited to an associated one or ones of the second penetration electrodes located at a different planar position as viewed from the stacking direction provided on the other of the second chips.

5. A semiconductor device comprising:
a first chip outputting a bank address signal and an active signal; and
a plurality of second chips stacked on the first chip, each of the second chips including a plurality of memory banks each selected based on the bank address signal, selected one or ones of the memory banks being brought into an active state in response to the active signal, wherein
each of the second chips activates a local bank active signal when at least one of the memory banks included therein is in the active state,
the first chip activates a bank active signal when at least one of the local bank active signals is activated, and
the first chip can perform a first operation mode in which all of the second chips constitute one address space, and can perform a second operation mode in which the second chips are divided into a plurality of ranks each having an independent address space.

6. The semiconductor device as claimed in claim 5, wherein the first chip selects one of the ranks based on a chip select signal supplied from outside when the second operation mode is selected.

7. The semiconductor device as claimed in claim 5, wherein
in the first operation mode the first chip activates the bank active signal when at least one of the local bank active signals supplied from the second chips is activated, and in the second operation mode the first chip activates the bank active signal corresponding to each of the ranks when at least one of the local bank active signals supplied from at least one of the second chips constituting corresponding one of the ranks is activated.

8. The semiconductor device as claimed in claim 7, wherein the first chip includes a logic circuit that changes a rank of at least one of the second chips.

9. A semiconductor device comprising:
a plurality of core chips stacked to each other, each of the core chips includes a plurality of memory banks; and
a control chip that controls the core chips, wherein
the control chip supplies a chip address signal and a bank address signal to the core chips in common in response to an active command, at least one of the core chips being selected based on the chip address signal, and at least one of the memory banks included in the selected one or ones of the core chips is brought into an active state based on the bank address signal,
each of the core chips activates a local bank active signal when at least one of the memory banks included therein is in the active state, and
wherein the control chip includes an active-signal generating circuit that receives the local bank active signals independently from the core chips, the active-signal generating circuit activating a bank active signal when at least one of the local bank active signals is activated.

10. A semiconductor device comprising:
a plurality of core chips stacked to each other, each of the core chips includes a plurality of memory banks; and
a control chip that controls the core chips, wherein
the control chip supplies a chip address signal and a bank address signal to the core chips in common in response to an active command, at least one of the core chips being selected based on the chip address signal, and at least one of the memory banks included in the selected one or ones of the core chips is brought into an active state based on the bank address signal, and
each of the core chips activates a local bank active signal when at least one of the memory banks included therein is in the active state,
wherein each of the core chips includes a plurality of first penetration electrodes penetrating through front and rear surfaces thereof, and
the local bank active signals respectively output from the core chips are transmitted to the control chip via the first penetration electrodes that are electrically independent of each other.

11. The semiconductor device as claimed in claim 10, wherein
each of the core chips further includes a plurality of second penetration electrodes penetrating through the front and rear surfaces thereof,
the second penetration electrodes each provided on different core chips and located at a same planar position are electrically connected to each other, and
the control chip transmits the chip address signal to the core chips via the second penetration electrodes.

12. The semiconductor device as claimed in claim 10, wherein
each of the core chips further includes a plurality of third penetration electrodes penetrating through the front and rear surfaces thereof,
the third penetration electrodes each provided on different core chips and located at a same planar position are electrically connected to each other, and the control chip transmits the bank address signal to the core chips via the third penetration electrodes.

13. A semiconductor device comprising:
a control chip configured to output a chip address signal and a bank address signal with issuing an active command; and
first and second core chips stacked with each other, each of the first and second core chips including a plurality of memory banks, one of the first and second core chips being configured to be selected in response to the chip address signal and one of the memory banks of the one of the first and second core chips being configured to be selected in response to the bank address signal, the one of the first and second core chips being configured to generate a local bank active signal in response to the one of the memory banks therein being selected;
each of the first and second core chips further including a substrate and a first penetration electrode penetrating the substrate thereof, the first penetration electrodes of the first and second core chips being out of alignment with each other in a first direction perpendicular to the substrate and being electrically coupled to each other, the local bank active signal being supplied from the one of the first and second core chips to the control chip via the first penetration electrode of the one of the first and second core chips.

14. The semiconductor device as claimed in claim 13, wherein the control chip is configured to output another chip address signal and another bank address signal with issuing the active command, another of the first and second core chips being configured to be selected in response to another chip address signal and another of the memory banks of another of first and second core chips being configured to be selected in response to another bank address signal, another of the first and second core chips being configured to generate another local bank active signal in response to another of the memory banks therein being selected;
each of the first and second core chips further including a second penetration electrode penetrating the substrate thereof, the second penetration electrodes of the first and second core chips being out of alignment with each other in the first direction and being electrically coupled to each other, another local bank active signal being supplied from another of the first and second core chips to the control chip via the second penetration electrode of another of the first and second core chips.

15. The semiconductor device as claimed in claim 14, wherein the second penetration electrode of the first core chip is aligned with the first penetration electrode of the second core chip in the first direction.

16. The semiconductor device as claimed in claim 15, wherein the first penetration electrode of the first core chip is out of alignment with the second penetration electrode of the second core chip in the first direction.

17. The semiconductor device as claimed in claim 16, wherein each of the first and second core chips further includes a third penetration electrode penetrating the substrate thereof, the third penetration electrodes of the first and second core chips being out of alignment with each other in the first direction and being electrically coupled to each other, the first penetration electrode of the first core chip being aligned with the third penetration electrode of the second core chip.

* * * * *